(12) United States Patent
Koike et al.

(10) Patent No.: US 7,491,984 B2
(45) Date of Patent: Feb. 17, 2009

(54) METHOD FOR FABRICATING GROUP III NITRIDE COMPOUND SEMICONDUCTORS AND GROUP III NITRIDE COMPOUND SEMICONDUCTOR DEVICES

(75) Inventors: Masayoshi Koike, Aichi (JP); Yuta Tezen, Aichi (JP); Toshio Hiramatsu, Aichi (JP); Seiji Nagai, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 314 days.

(21) Appl. No.: 10/978,438

(22) Filed: Nov. 2, 2004

(65) Prior Publication Data
US 2005/0093099 A1    May 5, 2005

Related U.S. Application Data

(62) Division of application No. 10/240,249, filed on Sep. 30, 2002, now Pat. No. 6,861,305.

(30) Foreign Application Priority Data

Mar. 31, 2000   (JP)   ............... 2000-99948
Mar. 31, 2000   (JP)   ............... 2000-99949

(51) Int. Cl.
*H01L 21/00*   (2006.01)
(52) U.S. Cl. .............. 257/190; 257/79; 257/103; 257/E21.131; 257/E21.566; 438/22; 438/479
(58) Field of Classification Search ............. 257/103, 257/190, E21.131, E21.566
See application file for complete search history.

(56) References Cited

U.S. PATENT DOCUMENTS 5,185,290 A   2/1993   Aoyagi et al.

| | | |
|---|---|---|
| 5,798,536 A | 8/1998 | Tsutsui |
| 6,051,849 A | 4/2000 | Davis et al. |
| 6,110,277 A | 8/2000 | Braun |
| 6,111,277 A * | 8/2000 | Ikeda ................ 257/99 |

(Continued)

FOREIGN PATENT DOCUMENTS

EP    0 551 721 A2    7/1993

(Continued)

OTHER PUBLICATIONS

Tsvetanka S. Zehleva, "Pendeo-Epitaxy: A New Approach for Lateral Growth of Gallium Nitride Films", Journal of Electronic Materials, vol. 28, No. 4, pp. L5-L8, Apr. 1999.

(Continued)

*Primary Examiner*—Dao H. Nguyen
(74) *Attorney, Agent, or Firm*—McGinn IP Law Group, PLLC

(57) ABSTRACT

The present invention provides a Group III nitride compound semiconductor with suppressed generation of threading dislocations.

A GaN layer 31 is subjected to etching, so as to form an island-like structure having a shape of, for example, dot, stripe, or grid, thereby providing a trench/mesa structure, and a mask 4 is formed at the bottom of the trench such that the upper surface of the mask 4 is positioned below the top surface of the GaN layer 31. A GaN layer 32 is lateral-epitaxially grown with the top surface 31a of the mesa and sidewalls 31b of the trench serving as nuclei, to thereby bury the trench, and then epitaxial growth is effected in the vertical direction. In the upper region of the GaN layer 32 formed above the mask 4 through lateral epitaxial growth, propagation of threading dislocations contained in the GaN layer 31 can be prevented.

11 Claims, 23 Drawing Sheets

U.S. PATENT DOCUMENTS

| | | | |
|---|---|---|---|
| 6,121,121 A | 9/2000 | Koide | |
| 6,146,457 A | 11/2000 | Solomon | |
| 6,153,010 A | 11/2000 | Kiyoku et al. | |
| 6,225,650 B1* | 5/2001 | Tadatomo et al. | 257/190 |
| 6,252,261 B1* | 6/2001 | Usui et al. | 257/190 |
| 6,274,518 B1 | 8/2001 | Yuri et al. | |
| 6,312,967 B1* | 11/2001 | Ikeda | 438/22 |
| 6,316,785 B1 | 11/2001 | Nunoue et al. | |
| 6,319,742 B1 | 11/2001 | Hayashi et al. | |
| 6,320,209 B1* | 11/2001 | Hata et al. | 257/190 |
| 6,329,667 B1 | 12/2001 | Ota et al. | |
| 6,355,497 B1 | 3/2002 | Romano et al. | |
| 6,365,921 B1 | 4/2002 | Watanabe et al. | |
| 6,521,514 B1* | 2/2003 | Gehrke et al. | 438/479 |
| 6,576,533 B2* | 6/2003 | Tomiya et al. | 438/481 |
| 6,582,986 B2 | 6/2003 | Kong et al. | |
| 2001/0009167 A1* | 7/2001 | Davis et al. | 148/33 |
| 2003/0107047 A1* | 6/2003 | Okuyama et al. | 257/95 |

FOREIGN PATENT DOCUMENTS

| | | |
|---|---|---|
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 05-041536 | 2/1993 |
| JP | 5-110206 | 4/1993 |
| JP | 5-283744 | 10/1993 |
| JP | 05-343741 | 12/1993 |
| JP | 6-196757 | 7/1994 |
| JP | 7-249830 | 9/1995 |
| JP | 07-273367 | 10/1995 |
| JP | 8-64791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 10-312611 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-21789 | 1/2000 |
| JP | 2000-44121 | 2/2000 |
| JP | 2000-091253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-093837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO 97/11518 | 3/1997 |
| WO | WO 98/47170 | 10/1998 |
| WO | WO 99/01594 | 1/1999 |
| WO | WO 00/04615 | 1/2000 |
| WO | WO 00/55893 | 9/2000 |
| WO | WO 02/058120 A1 | 7/2002 |

OTHER PUBLICATIONS

T.S. Zheleva, "Pendeo-Epitaxy versus Lateral Epitaxial Overgrowth of GaN: A Comparative Study via Finite Element Analysis", physica status solidi (a), vol. 176, No. 1, pp. 545-551, Nov. 1999.

Shiro Uchida, "AlGaInN based Laser Diodes", Proceedings of SPIE—The International Society for Optical Engineering, vol. 3947, pp. 156-164, Jan. 2000.

Nam, et al., "Lateral epitaxy of low defect density GaN layers via organometallic vapor phase epitaxy", pp. 2638-2640, Appl. Phys. Lett. 71 (18), Nov. 3, 1997.

Hiramatsu, et al., "Selective area growth and epitaxial lateral overgrowth of GaN by metalorganic vapor phase epitaxy and hydride vapor phase epitaxy", pp. 104-111, Materials Science and Engineering B59 (1999).

Akasaki, et al., "Effects of AlN Buffer Layer on Crystallographic Structure and on Electrical and Optical Properties of GaN and Ga1−xAlxN . . . Movpe" pp. 209-219, Journal of Crystal Growth 98 (1989) North Holland, Amsterdam.

Yang, et al., High quality GaN-InGaN heterostructures grown on (111) silicon substrates, pp. 3566-3568, Appl. Phys. Lett. 69 (23), Dec. 2, 1996.

Wolf, et al., "Silicon Processing for the VLSI Era", vol. 1, Lattice Press, 1986, p. 5.

Luther, et al., "Titanium and titanium nitride contacts to n-type gallium nitride", Semicond. Sci. Technol. 13 (1998) pp. 1322-1327.

Dimitriadis, et al., "Contacts of titanium nitride to- and p-type gallium nitride films", Solid-State Electronics 43 (1999), pp. 1969-1972.

European Search Report (EP 27057) Jul. 18, 2000.

European Search Report (EP 27279) Feb. 15, 2002.

D. Kapolnek, et al., "Anisotropic epitaxial lateral growth in GaN selective area epitaxy", Appl. Phys. Lett. 71(9), Sep. 1, 1997, pp. 1204-1206.

Matsushima, et al., "Selective growth of GaN on sub-micron pattern by MOVPE", Technical Report of IEICE, ED97-32, CPM97-20 (May 1997), pp. 41-46.

Ujiie, et al., "Epitaxial Lateral Overgrowth of GaAs on a Si Substrate", Japanese Journal of Applied Physics vol. 28, No. 3, Mar. 1989, pp. L337-L339.

Partial Translation of the Office Action for Japanese Patent Application No. 9-311518 dated Jun. 10, 2003.

Zheleva, et al., "Pendeo-Epitaxy-A New Approach for Lateral Growth of Gallium Nitride Structures", MRS Internet J. Nitride Semicond. Res. 4SI, G3.38 (1999), 6 pages total.

PCT Form 210 (PCT/JP02/05446), Jun. 3, 2002.

PCT Form 210 (PCT/JP02/02628), Mar. 19, 2002.
PCT Form 210 (PCT/JP02/01159), Feb. 12, 2002.
PCT Form 210 (PCT/JP01/01928), Dec. 3, 2001.
PCT Form 210 (PCT/JP01/02695), Mar. 29, 2001.
PCT Form 210 (PCT/JP00/09120), Dec. 21, 2000.
PCT Form 210 (PCT/JP01/01396), Feb. 23, 2001.
PCT Form 210 (PCT/JP01/01178), Feb. 19, 2001.
PCT Form 210 (PCT/JP01/01663), Mar. 2, 2001.
PCT Form 210 (PCT/JP00/09121), Dec. 21, 2000.
PCT Form 210 (PCT/JP00/09220), Dec. 25, 2000.
PCT Forms 338 and 409 (PCT/JP01/02695) and translation thereof, Mar. 29, 2001.
PCT Forms 338 and 409 (IPER) (PCT/JP01/01663) and translation thereof, Mar, 2, 2001.
PCT Forms 338 and 409 (IPER) (PCT/JP00/09120) and translation thereof, Dec. 21, 2000.
PCT Forms 338 and 409 (IPER) (PCT/JP00/09121) and translation thereof, Dec. 21, 2000.
PCT Forms 338 and 409 (IPER) (PCT/JP01/01928) and translation thereof, Mar. 12, 2001.
PCT Forms 338 and 409 (IPER) (PCT/JP01/01396) and translation thereof, Feb. 23, 2001.
PCT Forms 338 and 409 (IPER) (PCT/JP02/05446) and translation thereof, Jun. 3, 2002.
PCT Forms 338 and 409 (IPER) (PCT/JP02/02628) and translation thereof, Mar. 13, 2002.
PCT Forms 338 and 409 (IPER) (PCT/JP02/01159) and translation thereof, Feb. 12, 2002.

* cited by examiner

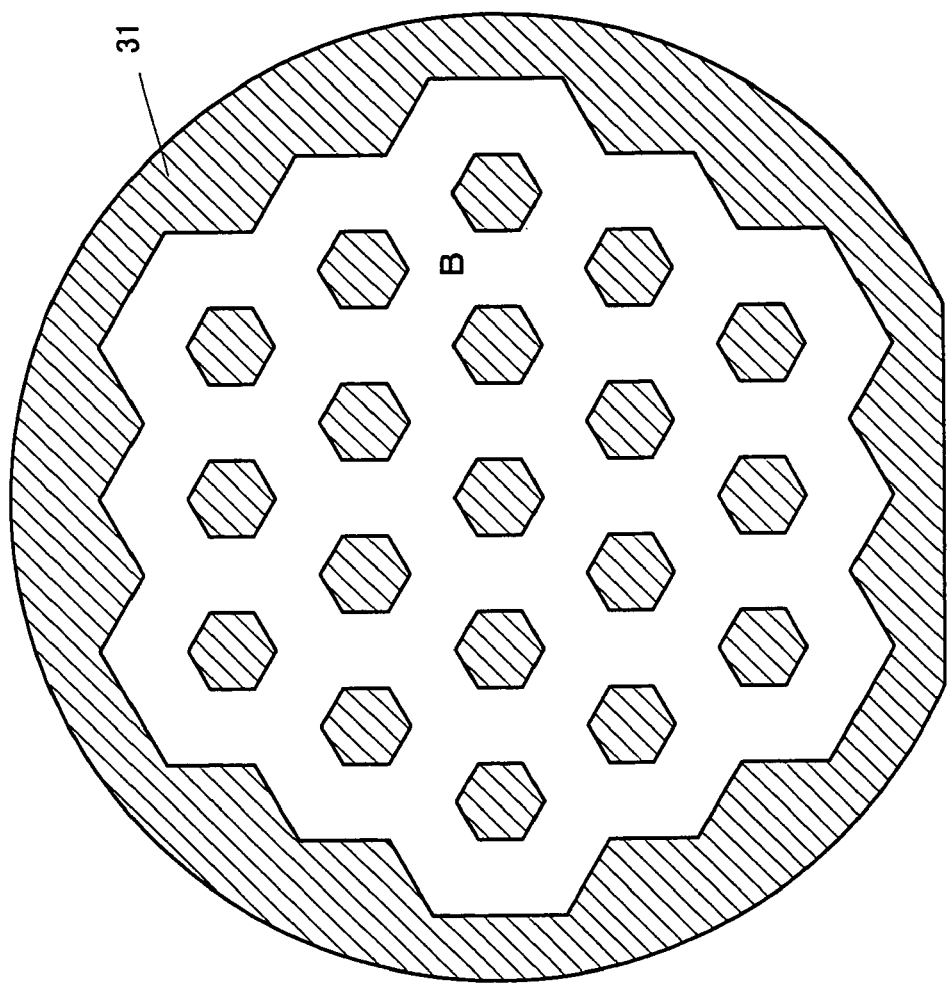
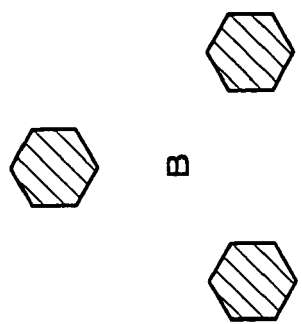
FIG. 22A
FIG. 22B

US 7,491,984 B2

METHOD FOR FABRICATING GROUP III NITRIDE COMPOUND SEMICONDUCTORS AND GROUP III NITRIDE COMPOUND SEMICONDUCTOR DEVICES

The present Application is a Divisional Application of U.S. patent application Ser. No. 10/240,249, filed on Sep. 30, 2002 now U.S. Pat. No. 6,861,305.

TECHNICAL FIELD

The present invention relates to a method for fabricating Group III nitride compound semiconductors. More particularly, the present invention relates to a method for fabricating Group III nitride compound semiconductors employing epitaxial lateral overgrowth (ELO). The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0<x<1$); and quaternary semiconductors such as $Al_xGa_yIn_{1-x-y}N$ (wherein $0<x<1$, $0<y<1$, and $0<x+y<1$). In the present specification, unless otherwise specified, "Group III nitride compound semiconductors" encompass Group III nitride compound semiconductors which are doped with an impurity so as to assume p-type or n-type conductivity.

BACKGROUND ART

Group III nitride compound semiconductor are direct-transition semiconductors exhibiting a wide range of emission spectra from UV to red light when used in an element such as a light-emitting device, and have been used in light-emitting devices such as light-emitting diodes (LEDs) and laser diodes (LDs). In addition, due to their broad band gaps, divices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconductor devices has been longed for from the environmental aspect. Generally, these Group III nitride compound semiconductors are formed on a sapphire substrate.

DISCLOSURE OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ $cm^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a schematic representation shown in FIG. 23. FIG. 23 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor element is fabricated by laminating various types of Group III nitride compound semiconductors of interest on the Group III nitride compound semiconductor layer 93, threading dislocations further propagate upward, through the semiconductor element, from dislocation arrival points 902 on the surface of the Group III nitride compound semiconductor layer 93. Thus, according to conventional techniques, problematic propagation of dislocations cannot be prevented during formation of Group III nitride compound semiconductor layers.

In recent years, in order to prevent propagation of the threading dislocations, techniques employing lateral growth of crystal have been developed. According to the techniques, a mask partially provided with an array of slits, which is formed from a material such as silicon oxide or tungsten, is provided on a sapphire substrate or a Group III nitride compound semiconductor layer, and crystal growth is elicited to proceed laterally on the mask, with the slits serving as nuclei.

Among similar techniques is a technique called pendeo-epitaxial lateral overgrowth (pendeo-ELO), in which laterally growing portions are formed such that they are suspended above the surface of the substrate.

In ELO employing a mask, the upper surface of the mask is positioned above the portions of the semiconductor layer which are exposed through the slits so as to serve as nuclei for crystal growth. Thus, crystal growth proceeds firstly upward from semiconductor of the slit portions serving as nuclei, and subsequently, turns around onto the upper surface of the mask, and progresses laterally thereon. As a result, considerable amounts of dislocations and considerable strain generate at the mask edges, and threading dislocations generated in these portions cause difficulties in reducing threading dislocations.

The pendeo-ELO technique also involves a similar problem; since a mask is formed on the upper surface of a layer providing nuclei for crystal growth, when crystal growth proceeds around the edge portions onto the upper surface of the mask, problematic threading dislocations generate at the mask edges.

The present invention has been accomplished in an attempt to solve the aforementioned problems, and an object of the present invention is to fabricate a Group III nitride compound semiconductor with suppressed generation of threading dislocations.

In order to solve the aforementioned problems, the invention drawn to a first feature provides a method for fabricating a Group III nitride compound semiconductor through epitaxial growth thereof on a substrate, which method comprises a step of etching an underlying layer comprising at least one layer of a Group III nitride compound semiconductor, the uppermost layer of the underlying layer being a first Group III nitride compound semiconductor layer, so as to form an island-like structure having a shape of, for example, dot, stripe, or grid, thereby providing a trench/mesa or a trench/post structure, such that the area of a horizontal cross section of the mesa is reduced to zero in association with an increase in the distance between the cross section and the substrate; a step of forming a mask on the first Group III nitride compound semiconductor layer so as to expose merely a top portion of the first Group III nitride compound semiconductor layer; and a step of epitaxially growing, vertically and laterally, a second Group III nitride compound semiconductor layer around the top portion of the first Group III nitride compound semiconductor layer, which is exposed through the mask and serves as a nucleus for crystal growth, i.e., seed. In the present specification, the term "underlying layer" is used to collectively encompass a Group III nitride compound semiconductor single layer and a multi-component layer containing at least one Group III nitride compound semiconductor layer. The expression "island-like structure" conceptually refers to the pattern of the upper portions of the mesas formed through etching, and does not necessarily refer to regions separated from one another. Thus, the upper portions of the mesas may be continuously connected to one another over a considerably wide area, and such a structure may be obtained by forming the entirety of a wafer into stripes or grids. The sidewall/sidewalls of the trench refers not only to a plane oblique to the substrate plane and the surface of a Group III nitride compound semiconductor, but also to a vertical plane or a curved plane. The trench may have a V-shaped cross section; i.e., the trench may have no bottom surface. As specifically described below, no particular limitation is imposed on the shape of the mesa, so long as the area of a horizontal cross section of the mesa is increased in association with reduction in the distance between the cross section and the substrate. Unless otherwise specified, these definitions are equally applied to the below-appended features.

The invention drawn to a second feature provides a method for fabricating a Group III nitride compound semiconductor, wherein the island-like structure is formed of numerous laterally aligned triangular-prism-shaped mesas or posts, and the area of a horizontal cross section of each of the mesas is reduced to zero in association with an increase in the distance between the cross section and the substrate. Examples of such an island-like structure include, but are not limited to, a structure as shown in FIG. 3C.

The invention drawn to a third feature provides a method for fabricating a Group III nitride compound semiconductor, wherein the island-like structure is formed of numerous cone- or pyramid-shaped mesas or posts, and the area of a horizontal cross section of each of the mesas is reduced to zero in association with an increase in the distance between the cross section and the substrate. Examples of such an island-like structure include, but are not limited to, a structure formed of pyramids as shown in FIG. 3D.

The invention drawn to a fourth feature provides a method for fabricating a Group III nitride compound semiconductor, wherein the first Group III nitride compound semiconductor layer and the second Group III nitride compound semiconductor layer have the same composition. As used herein, the term "same composition" does not exclude differences in a doping level (differences of less than 1 mol %).

The invention drawn to a fifth feature provides a method for fabricating a Group III nitride compound semiconductor, wherein the mask is formed of an electrically conductive metal such as tungsten (W).

The invention drawn to a sixth feature provides a Group III nitride compound semiconductor device, which is formed atop a Group III nitride compound semiconductor layer produced through a method for fabricating a Group III nitride compound semiconductor as recited in connection with any one of the first to fifth features.

The invention drawn to a seventh feature provides a Group III nitride compound semiconductor light-emitting device, which is produced by laminating a different Group III nitride compound semiconductor layer atop a Group III nitride compound semiconductor layer produced through a method for fabricating a Group III nitride compound semiconductor as recited in connection with any one of the first to fifth features.

The invention drawn to an eighth feature provides a method for fabricating a Group III nitride compound semiconductor substrate, which comprises a method for fabricating a Group III nitride compound semiconductor as recited in connection with any one of the first to fifth features, and removing substantially entire portions including the substrate and the mask.

In order to solve the aforementioned problems, the invention drawn to a ninth feature provides a method for fabricating a Group III nitride compound semiconductor through epitaxial growth thereof on a substrate, which comprises a step of etching an underlying layer comprising at least one layer of a Group III nitride compound semiconductor, the uppermost layer of the underlying layer being a first Group III nitride compound semiconductor layer, so as to form an island-like structure having a shape of, for example, dot stripe, or grid, thereby providing a trench/mesa or a trench/post structure, such that an intermediate layer constituting the underlying layer or the substrate is exposed through the bottom of the trench; a step of forming a mask at the bottom of the trench such that the upper surface of the mask is positioned below the upper surface of the uppermost layer of the underlying layer; and a step of epitaxially growing, vertically and laterally, a second Group III nitride compound semiconductor layer around the upper surface and sidewall of the mesa or post serving as a nucleus for crystal growth, i.e., seed, the mesa being formed through etching of the underlying layer so as to form an island-like structure having a shape of, for example, dot, stripe, or grid.

In the present specification, the term "underlying layer" is used so as to collectively encompass a Group III nitride compound semiconductor single layer and a multi-component layer containing at least one Group III nitride compound semiconductor layer. The expression "island-like structure" conceptually refers to the pattern of the upper portions of the mesas formed through etching, and does not necessarily refer to regions separated from one another. Thus, the upper portions of the mesas may be continuously connected to one another over a considerably wide area, and such a structure may be obtained by forming the entirety of a wafer into stripes or grids. The sidewall/sidewalls of the trench refers not only to a plane vertical to the substrate plane and the surface of a Group III nitride compound semiconductor, but also to an oblique plane. The trench may have a V-shaped cross-section; i.e., the trench may have no bottom surface. Unless otherwise specified, these definitions are equally applied to the below-appended claims.

The invention drawn to a tenth feature provides a method for fabricating a Group III nitride compound semiconductor as recited in connection with the first feature, wherein the mask is formed of a substance capable of impeding epitaxial growth of a Group III nitride compound semiconductor on the mask.

The invention drawn to an eleventh feature provides a method for fabricating a Group III nitride compound semiconductor, wherein virtually all the sidewalls of the trench assume a {11-20} plane.

The invention drawn to a twelfth feature provides a method for fabricating a Group III nitride compound semiconductor, wherein the first Group III nitride compound semiconductor layer and the second Group III nitride compound semiconductor layer have the same composition. As used herein, the term "same composition" does not exclude differences in doping level (differences of less than 1 mol %).

The invention drawn to a thirteenth feature provides a method for fabricating a Group III nitride compound semiconductor, wherein the mask is formed of an electrically conductive film, such as a silicon oxide film, a silicon nitride film, a tungsten film, or a titanium nitride film.

The invention drawn to a fourteenth feature provides a Group III nitride compound semiconductor element, which is formed atop a lateral-epitaxially grown portion of a Group III nitride compound semiconductor layer produced through a method for fabricating a Group III nitride compound semiconductor as recited in connection with any one of the ninth to thirteenth features.

The invention drawn to a fifteenth feature provides a Group III nitride compound semiconductor light-emitting element, which is produced by laminating a different Group III nitride compound semiconductor layer atop a lateral-epitaxially grown portion of a Group III nitride compound semiconductor layer produced through a method for fabricating a Group III nitride compound semiconductor as recited in connection with any one of the ninth to thirteenth features.

The invention drawn to a sixteenth feature provides a method for fabricating a Group III nitride compound semiconductor substrate, which comprises a method for fabricating a Group III nitride compound semiconductor as recited in connection with any one of the ninth to thirteenth features, and removing substantially entire portions except for an upper layer formed on a portion provided through lateral epitaxial growth.

The invention drawn to a seventeenth feature provides a Group III nitride compound semiconductor substrate produced through a method as recited in connection with the sixteenth feature.

The outline of an example of the method for fabricating a Group III nitride compound semiconductor of the present invention will next be described with reference to FIGS. 1 and 2. Although FIGS. 1 and 2 illustrate layers accompanied by a substrate 1001 and a buffer layer 1002 so as to facilitate understanding of the description, the substrate 1001 and the buffer layer 1002 are not essential elements of the present invention, in view that the present invention is to produce, by employment of a Group III nitride compound semiconductor having threading dislocations in the vertical direction, a Group III nitride compound semiconductor layer including a region in which threading dislocations in the vertical direction are reduced. The gist of the operation and effects of the present invention will next be described with reference to an embodiment in which a first Group III nitride compound semiconductor layer 1031 having threading dislocations in the vertical direction (direction vertical to the substrate surface) is provided on the substrate 1001 via the buffer layer 1002.

As shown in FIG. 1A, the first Group III nitride compound semiconductor layer 1031 is subjected to etching, so as to form an island-like structure having a shape of, for example, dot, stripe, or grid, thereby providing trenches, such that the area of a horizontal cross section of each of the mesas is reduced to zero in association with an increase in the distance between the cross section and the substrate 1. Subsequently, an etchable mask 1004 is formed on the first Group III nitride compound semiconductor layer 1031 (FIG. 1B). Subsequently, merely portions of the mask 1004 that cover tops T of the first Group III nitride compound semiconductor layer 1031 are subjected to selective etching, to thereby expose the tops T of the first Group III nitride compound semiconductor layer 1031 (FIG. 1C). Subsequently, a second Group III nitride compound semiconductor layer 1032 is epitaxially grown, vertically and laterally, around the thus-exposed tops T of the first Group III nitride compound semiconductor layer 1031 serving as nuclei for crystal growth, i.e., seeds (FIGS. 2D and 2E). In this case, merely threading dislocations which propagate to the exposed tops T of the first Group III nitride compound semiconductor layer 1031 propagate through the second Group III nitride compound semiconductor layer 1032. Therefore, the threading dislocation density of the semiconductor layer 1032 can be reduced. When an initial epitaxial growth plane is oblique to the substrate as shown in FIG. 2D, the propagation direction of threading dislocations is not perpendicular to the substrate. Therefore, propagation of threading dislocations to an upper portion of the second Group III nitride compound semiconductor layer 1032 can be substantially prevented.

Through taper etching, there can be readily formed an island-like structure formed of numerous laterally aligned triangular-prism-shaped mesas as shown in FIG. 3C, in which the area of a horizontal cross section of each of the mesas is reduced to zero in association with an increase in the distance between the cross section and the substrate (claim 2). When an island-like structure is formed of numerous pyramid-shaped mesas as shown in FIG. 3D, in which the area of a horizontal cross section of each of the mesas is reduced to zero in association with an increase in the distance between the cross section and the substrate, the area of the exposed tops T of the first Group III nitride compound semiconductor layer 1031 becomes considerably smaller than that of the substrate surface (claim 3).

When the first Group III nitride compound semiconductor layer and the second Group III nitride compound semiconductor layer have the same composition, rapid epitaxial growth can be readily attained (claim 4).

In the case where the mask is formed of an electrically conductive metal, and the first Group III nitride compound semiconductor layer and the second Group III nitride compound semiconductor layer exhibit electrical conductivity, current can be conducted from the first Group III nitride compound semiconductor layer through the electrically conductive mask to the second Group III nitride compound semiconductor layer (claim 5).

By forming an element atop the Group III nitride compound semiconductor layer formed through the above process, there can be provided a semiconductor element having a layer containing few defects and endowed with high mobility (claim 6). By forming a light-emitting element atop the Group III nitride compound semiconductor layer formed through the above process, there can be provided a light-emitting element endowed with improved service life and improved LD threshold value (claim 7).

By selectively separating, from the other layers, the Group III nitride compound semiconductor layer 1032 that is provided through lateral epitaxial growth through the above process, there can be produced a high-crystallinity Group III nitride compound semiconductor in which crystal defects such as dislocations are remarkably suppressed (claim 8). In this connection, for the sake of convenience in manufacture, the expression "removing substantially entire portions" does not exclude the case in which a portion containing threading dislocations is present to some extent.

The outline of an example of the method for fabricating a Group III nitride compound semiconductor of the present invention will next be described with reference to FIG. 12. Although FIG. 12 illustrates layers accompanied by a substrate 1 and a buffer layer 2 so as to facilitate description and understanding of the dependent clams, the buffer layer 2 is not an essential element of the present invention, in view that the present invention is to produce, by employment of a Group III nitride compound semiconductor having threading dislocations in the vertical direction, a Group III nitride compound semiconductor layer including a region in which threading dislocations in the vertical direction are reduced. The gist of the operation and effects of the present invention will next be described with reference to an embodiment, in which a first Group III nitride compound semiconductor layer 31 having threading dislocations in the vertical direction (direction vertical to the substrate surface) is provided on the surface of the substrate 1 via the buffer layer 2.

As shown in FIG. 12A, the first Group III nitride compound semiconductor layer 31 is subjected to etching, so as to form an island-like structure having a shape of, for example, dot, stripe, or grid, thereby providing trenches/mesas, such that the surface of the substrate 1 is exposed through the bottoms of the trenches. Subsequently, masks 4 are formed on the exposed surface of the substrate 1, such that upper surfaces 4a of the masks 4 are positioned below upper surfaces 31a of the first Group III nitride compound semiconductor layer 31. In the above manner, a second Group III nitride compound layer 32 is epitaxially grown, vertically and laterally, with the upper surfaces 31a of the mesas and sidewalls 31b of the trenches serving as nuclei for crystal growth, i.e., seeds, to thereby bury the trenches or provide cavities on the upper surfaces 4a of the masks 4, while epitaxial growth is effected in the vertical direction. In this case, propagation of threading dislocations contained in the first Group III nitride compound semiconductor layer 31 can be prevented in the upper portion of the second Group III nitride compound semiconductor layer 32 that is formed through lateral epitaxial growth, and a region in which threading dislocations are reduced is provided in the thus-buried or bridged trenches (claim 9). Thus, lateral epitaxial growth is immediately attained, with the sidewalls of the trenches serving as nuclei. Specifically, in conventional ELO employing a mask, the height of the mask portion is greater than that of the growth nucleus portion by an amount corresponding to the thickness of the mask, and crystal growth proceeds in the vertical direction for a length corresponding to the mask thickness, and then turns around onto the top surface of the mask, to thereby initiate lateral growth. As a result, growing crystals are strained at the edge of the mask where the growth direction is changed, to thereby induce dislocations. In the present invention, the second Group III nitride compound semiconductor layer 32 is laterally grown immediately on the mask, in a manner other than that in which growth direction is changed along the mask, to thereby remove strain from the crystals, and suppress generation of dislocations. Because growth direction is not changed along the mask 4, conceivably, the mask 4 is not bonded to the second Group III nitride compound semiconductor layer 32, or bonding between the mask 4 and the layer 32 is weak. Therefore, strain induced from the mask 4 in the second Group III nitride compound semiconductor layer 32 can be suppressed. Alternatively, growth may be performed such that a cavity is provided between the mask and the second Group III nitride compound semiconductor layer 32. When growth is performed while a cavity is provided, strain induced from the mask can be completely suppressed, to thereby form crystals of more excellent quality. In conventional ELO in which the direction of growth is changed along the mask, layers grown from the both surfaces serving as nuclei coalesce at a center site. In this case, crystal axes of two layers are known to be slightly tilted from each other. Generation of such tilting can be prevented by providing a cavity between the mask 4 and the second Group III nitride compound semiconductor layer 32. Thus, there can be provided a lateral growth layer of quality higher than that obtained in a conventional method.

Threading dislocations are not propagated in the vertical direction in a portion formed through lateral growth. If epitaxial growth yields no substantial discontinuity in the interface between the Group III nitride compound semiconductor layer 31 or the buffer layer 2 and the second Group III nitride compound semiconductor layer 32, when the mask is formed of an electrically conductive substance such as tungsten, no electrical resistance attributed to a discontinuous portion is generated with respect to current flow in the vertical direction (direction normal to the surface of the substrate 1), as compared with a similar structure having a mask formed of an insulator or the like. Furthermore, a stable structure can be produced.

When the second Group III nitride compound semiconductor 32 for burying or bridging the trench is not epitaxially grown from the substrate 1; i.e., the bottom portion of the trench, in the vertical direction or the rate of such epitaxial growth is very low, there occurs much more rapid coalescence of lateral epitaxial growth fronts starting from the sidewalls of the trench facing each other. In the upper portion of the thus-buried or bridged Group III nitride compound semiconductor layer 32, no threading dislocations are propagated from the layer provided beneath the layer 32. The sidewall of the trench is not necessarily perpendicular to the substrate. When the sidewall is perpendicular to the substrate, the threading dislocation density of the sidewall is very low. Therefore, when the second Group III nitride compound semiconductor layer 32 is laterally grown from the sidewall having a very low threading dislocation density, the threading dislocation density of the resultant laterally grown region is considerably reduced. As a result, a crystal region of remarkably high quality can be provided. As shown in FIG. 12C, when lateral growth further proceeds through coalescence of lateral epitaxial growth fronts starting from the sidewalls of the trench facing each other, the second Group III nitride compound semiconductor grown above the substrate attains a uniform, large thickness. The substrate is not necessarily exposed through the bottom of the trench; the upper surface of the buffer layer 2 may be exposed through the bottom of the trench. Alternatively, etching of the first Group III nitride compound semiconductor layer 31 may be stopped when the depth of the trench reaches a certain level, to thereby expose the surface of an intermediate layer constituting the layer 31. Furthermore, the surface of an arbitrary layer among a plurality of layers constituting the underlying layer comprising at least the first Group III nitride compound semiconductor layer 31 may be exposed through the bottom of the trench.

The mask may be formed of a multi-layer film formed from a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal of high melting point, such as titanium (Ti) or tungsten (W). Preferably, the mask is formed of a substance capable of impeding vertical growth of the second Group III nitride compound semiconductor layer 32 on the mask (claims 10 and 13).

The aforementioned rapid lateral epitaxial growth can be readily attained when the sidewall of the trench of the Group III nitride compound semiconductor layer 31 assumes a {11-20} plane (claim 11). During lateral epitaxial growth, at least an upper portion of the growth front may remain a {11-20} plane. When the first Group III nitride compound semiconductor layer and the second Group III nitride compound semiconductor layer have the same composition, rapid lateral epitaxial growth can be readily attained (claim 12).

Through the procedure described above, threading dislocations propagated from the first Group III nitride compound semiconductor layer 31 can be prevented, to thereby provide the second Group III nitride compound semiconductor layer 32 of stable structure. Although FIG. 12 illustrates a sidewall of the trench vertical to the substrate plane, the present invention is not limited thereto, and the sidewall may be an oblique plane. The trench may have a V-shaped cross-section. A mask may be formed on the trench. These features are equally applied to the descriptions below.

By forming an element atop a lateral-epitaxially grown portion of the Group III nitride compound semiconductor layer produced through the above process, a semiconductor element having a layer containing few defects and endowed with high mobility can be provided (claim 14).

By forming a light-emitting element atop a lateral-epitaxially grown portion of the Group III nitride compound semiconductor layer produced through the above process, a light-emitting element endowed with improved service life and an improved LD threshold value can be provided (claim 15).

By selectively separating, from the other layers, an upper layer formed on a portion provided through lateral epitaxial growth in the Group III nitride compound semiconductor layer obtained through the above process, there can be produced a high-crystallinity Group III nitride compound semiconductor in which crystal defects such as dislocations are remarkably suppressed (claims 16 and 17). In addition, a high-crystallinity Group III nitride compound semiconductor substrate can be produced. In this connection, for the sake of convenience in manufacture, the expression "removing substantially entire portions" does not exclude the case in which a portion containing threading dislocations is present to some extent.

While laterally grown regions of the above-formed second Group III nitride compound semiconductor layer are caused to remain, regions having been served as nuclei for crystal growth may be etched, to thereby expose the substrate or to expose the surface of an intermediate layer constituting the underlying layer. And the aforementioned lateral crystal growth may be repeated. That is, a mask is formed on the exposed surface such that the mask is positioned below a layer serving as a nuclei for crystal growth, and second lateral growth may be performed above the mask. In this case, since crystals serving as nuclei for crystal growth during the second lateral growth are formed by lateral growth, the threading dislocation density of the crystals is very low. Therefore, a layer which is laterally grown with the crystals serving as nuclei has a low threading dislocation density. Thus, a Group III nitride compound semiconductor can be uniformly and laterally grown above the substrate. No particular limitation is imposed on the repetition time of such lateral growth.

The aforementioned Group III nitride compound semiconductor layer having a region in which threading dislocations are reduced may be separated from the substrate 1, the buffer layer 2, and the mesa formed through etching in which threading dislocations are not reduced, to thereby form a Group III nitride compound semiconductor substrate. A Group III nitride compound semiconductor element may be formed on the resultant semiconductor substrate. The substrate may be employed for forming a larger Group III nitride compound semiconductor crystal. Removal of the substrate 1, the buffer layer 2, and the mesa may be carried out through any technique, such as mechanochemical polishing.

BRIEF DESCRIPTION OF THE DRAWINGS

FIGS. 22A-22B are schematic representations showing yet another example of etching of a first Group III nitride compound semiconductor.

BEST MODE FOR CARRYING OUT THE INVENTION

First Preferred Mode for Carrying Out the Invention

Figure 1A:
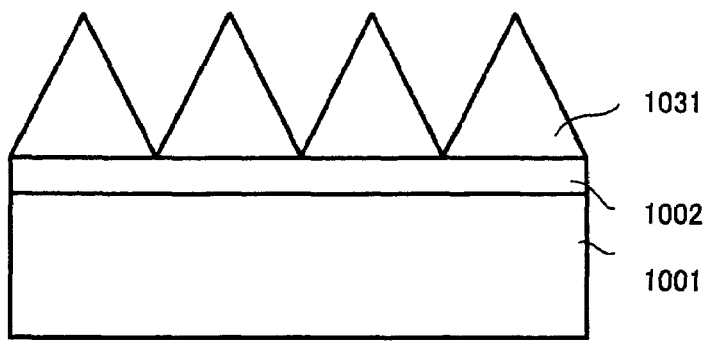
FIGS. 1A-1C are a series of cross-sectional views showing the first half of the steps of fabricating a Group III nitride compound semiconductor according to a first embodiment of the present invention.
Figure 1B:
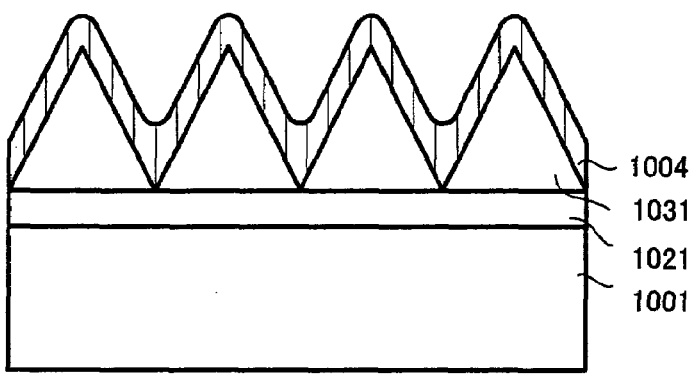
Figure 1C:
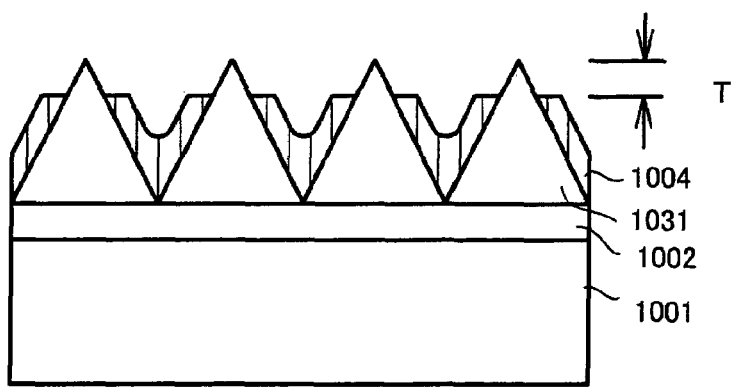
Figure 2D:
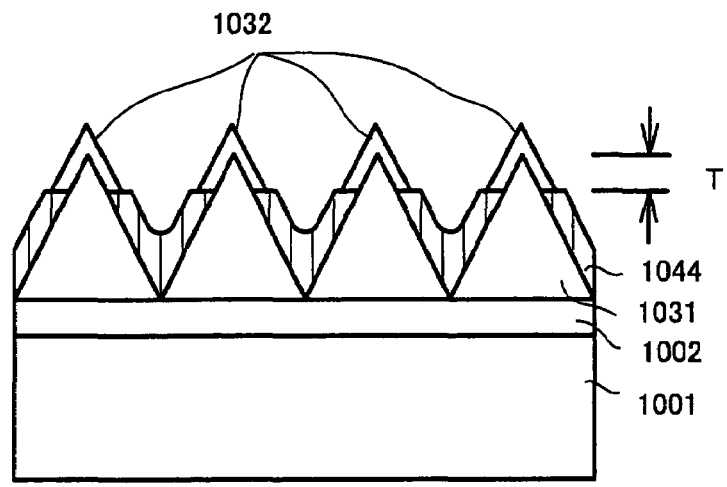
FIGS. 2D-2E are a series of cross-sectional views showing the second half of the steps of fabricating a Group III nitride compound semiconductor according to the first embodiment of the present invention.
Figure 2E:
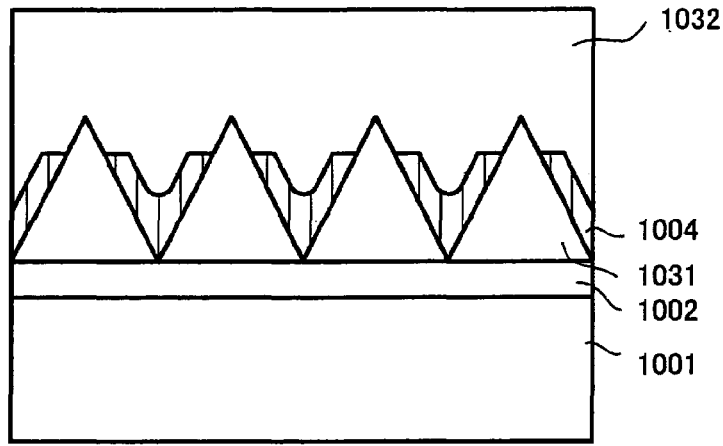

FIGS. 1 and 2 schematically show a mode for carrying out a method for fabricating a Group III nitride compound semiconductor of the present invention. A substrate 1001, a buffer layer 1002, and a first Group III nitride compound semiconductor layer 1031 are formed, and the layer 1031 is subjected to etching, to thereby form tapered mesas (FIG. 1A). The angle of tops T is preferably small. Subsequently, an etchable mask 1004 is formed on the first Group III nitride compound semiconductor layer 1031 through, for example, sputtering (FIG. 1B). Subsequently, merely portions of the mask 1004 that cover the tops T of the first Group III nitride compound semiconductor layer 1031 are subjected to selective etching, to thereby expose the tops T of the first Group III nitride compound semiconductor layer 1031 (FIG. 1C). In order to expose the tops T, portions of the mask 1004 that cover the tops T may be removed by means of a lift-off method as a method other than selective etching of the mask 1004. Alternatively, the mask 1004 may be formed so as not to cover the tops T, through deposition employing a mask. Subsequently, a second Group III nitride compound semiconductor layer 1032 is epitaxially grown, vertically and laterally, around the thus-exposed tops T of the first Group III nitride compound semiconductor layer 1031 serving as nuclei (FIGS. 2D and 2E). In this case, merely threading dislocations which propagate to the exposed tops T of the first Group III nitride compound semiconductor layer 1031 propagate through the second Group III nitride compound semiconductor layer 1032. In other words, threading dislocations which propagate through the second Group III nitride compound semiconductor layer 1032 are merely threading dislocations which propagate to the exposed tops T of the first Group III nitride compound semiconductor layer 1031. Therefore, the threading dislocation density of the second Group III nitride compound semiconductor layer 1032 becomes very low. The threading dislocation density is determined by the ratio between the area of the substrate surface and the area of the top T of the first Group III nitride compound semiconductor layer 1031 (i.e., the area of a projection profile of the top T as viewed in a direction perpendicular to the substrate). The smaller the area of the top T (the area of a projection profile of the top T as viewed in a direction perpendicular to the substrate), the smaller the number of threading dislocations which propagate through the second Group III nitride compound semiconductor layer 1032. When the angle of the top T is small, the area of the top T (the area of a projection profile of the top T as viewed in a direction perpendicular to the substrate) can be readily reduced.

An underlying layer may be a layer including a plurality of units, each having a buffer layer formed on a substrate and a Group III nitride compound semiconductor layer grown epitaxially on the buffer layer. Portions of the Group III nitride compound semiconductor layer 1032 that are formed around the tops T (i.e., nuclei) through epitaxial growth become regions in which threading dislocations of vertical propagation are suppressed.

Second Preferred Mode for Carrying Out the Invention

Figure 12A:
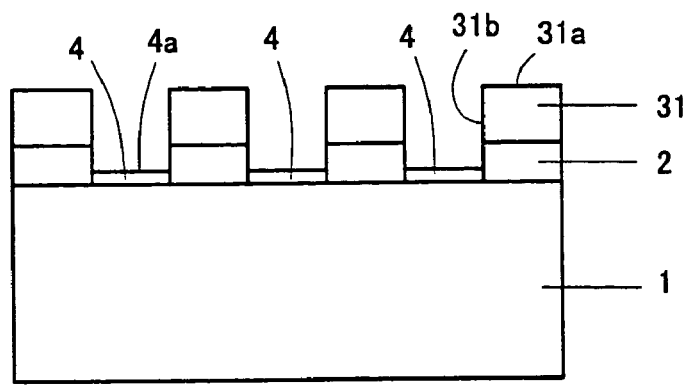
FIGS. 12A-12C are a series of cross-sectional views showing the steps of fabricating a Group III nitride compound semiconductor according to an eighth embodiment of the present invention.

FIG. 12 schematically shows a mode for carrying out a method for fabricating a Group III nitride compound semiconductor of the present invention. FIG. 12 shows an example in which a substrate 1 is exposed. A buffer layer 2 and a first Group III nitride compound semiconductor layer 31 are successively formed on the substrate 1, and the layers 2 and 31 are subjected to etching, to thereby form trenches (FIG. 12A). As a result of etching, mesas or posts and trenches are formed; the unetched surface providing the tops of the mesas or posts; and sidewalls and bottom portions (bottom surfaces) of the trenches are formed. The sidewalls are, for example, {11-20} planes. Subsequently, masks 4 are formed merely at the bottom portions of the trenches such that the upper surfaces of the masks 4 are positioned below the tops 31a of the mesas or posts. The masks 4 are formed through the following procedure: a mask is formed through, for example, sputtering, so as to uniformly cover the entire surfaces of the mesas or posts and trenches, and then unwanted portions of the mask are removed through photolithography. Alternatively, the masks 4 may be formed through a lift-off method in which a resist is applied to the tops 31a and the sidewalls of the mesas, and a mask is formed so as to uniformly cover the entire surfaces of the mesas and trenches, followed by removal of the resist.

Figure 12B:
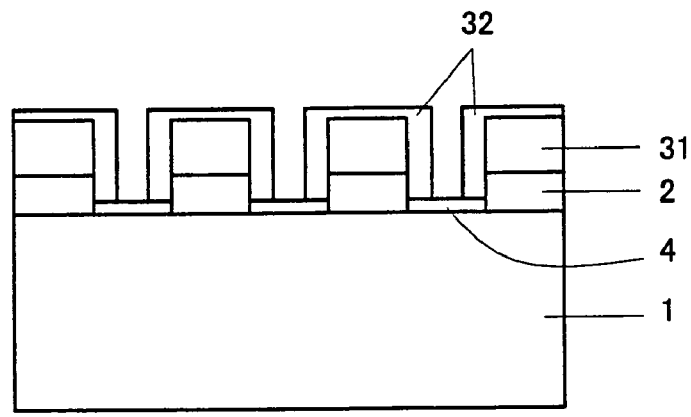
Figure 12C:
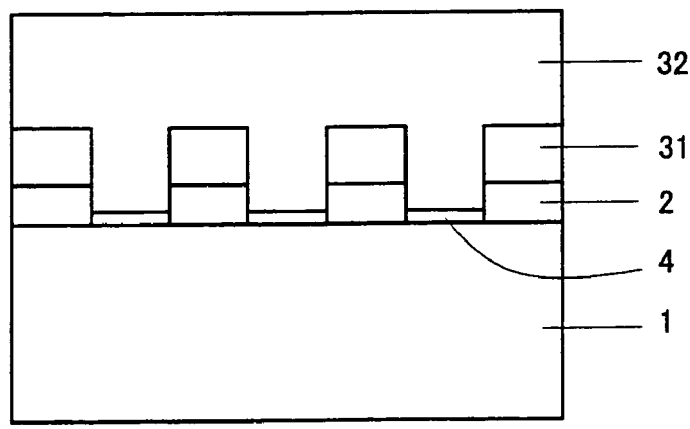

Subsequently, under conditions of lateral epitaxial growth, a second Group III nitride compound semiconductor layer 32 is epitaxially grown while the sidewalls of the trenches and the top surfaces of the mesas or posts serve as nuclei for crystal growth. A metal-organic growth process enables easy lateral epitaxial growth while the growth fronts remain the {11-20} planes. Portions of the second Group III nitride compound semiconductor layer 32 which are laterally grown from the sidewalls of the trenches are free from propagation of threading dislocations from the mask 4 (FIG. 12B). The form of etching and lateral epitaxial growth conditions are determined such that the fronts of lateral growth extending from the opposite sidewalls of the trenches coalesce above the bottoms of the etched trenches, whereby threading dislocations are suppressed in the regions of the second Group III nitride compound semiconductor layer 32 formed above the bottoms of the etched trenches (FIG. 12C). In the lateral growth step of FIG. 12B, through optimization of growth temperature, pressure, and the III/V ratio of material to be supplied, lateral growth can become much faster than vertical growth.

Figure 13A:
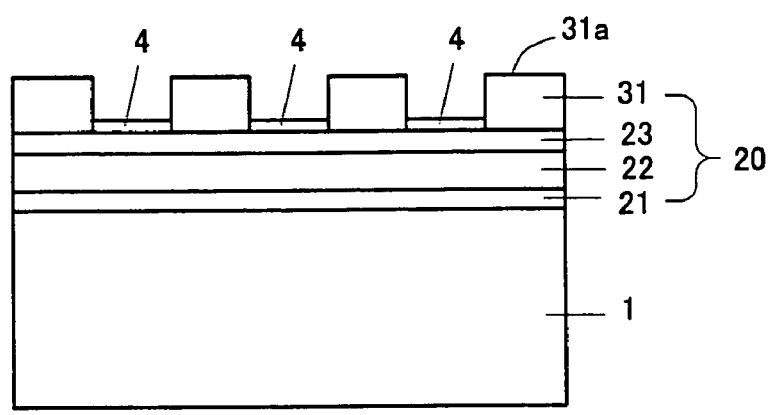
FIGS. 13A-13C are a series of cross-sectional views showing the steps of fabricating a Group III nitride compound semiconductor according to a ninth embodiment of the present invention.
Figure 13B:
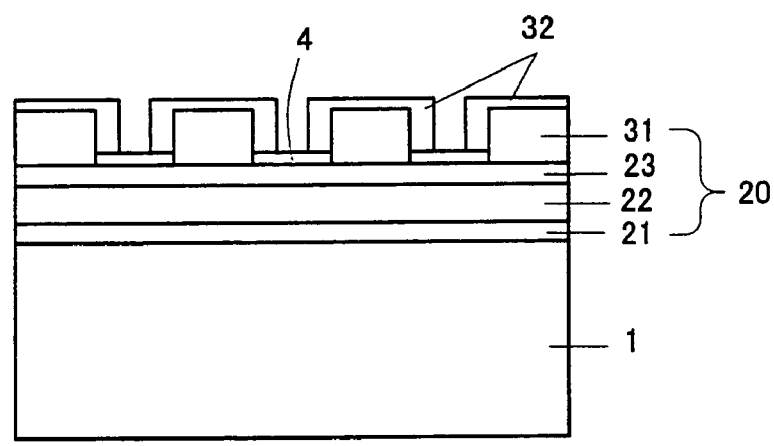
Figure 13C:
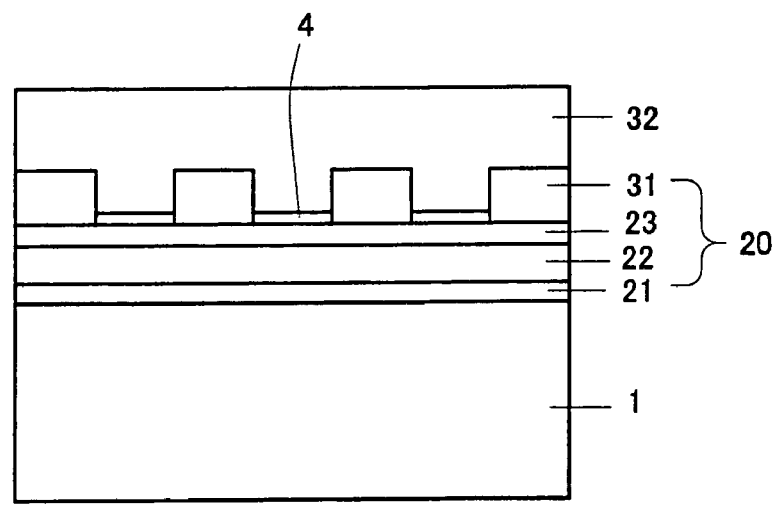
Figure 14A:
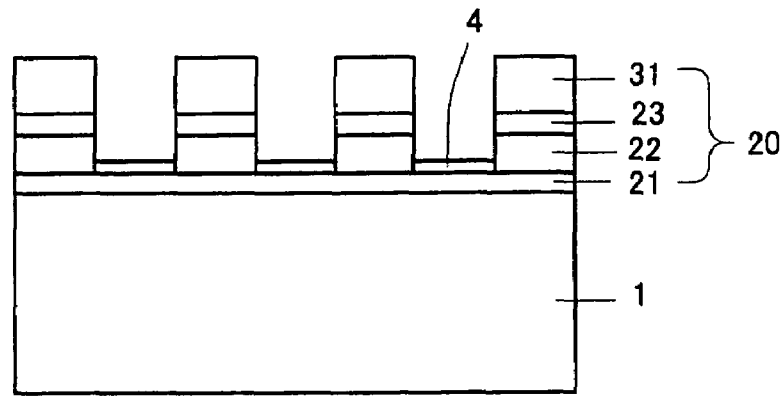
FIGS. 14A-14C are a series of cross-sectional views showing the steps of fabricating a Group III nitride compound semiconductor according to a tenth embodiment of the present invention.
Figure 14B:
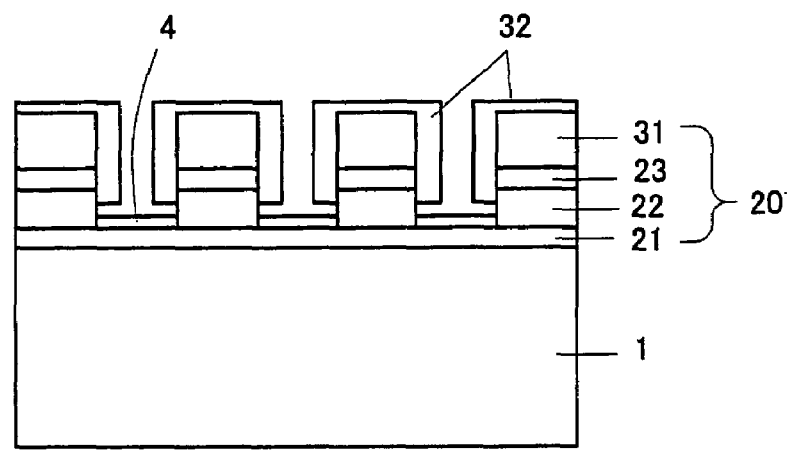
Figure 14C:
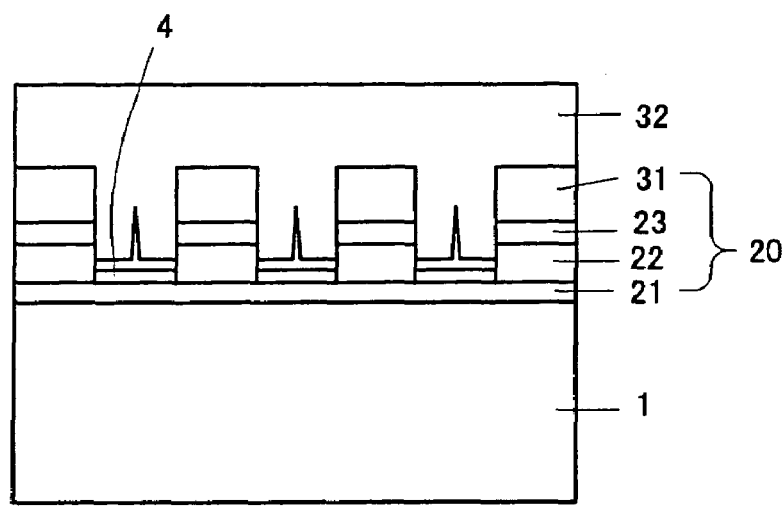

As shown in FIG. 13, there may be employed, as a nucleus for lateral crystal growth, an underlying layer including a plurality of units, each having a buffer layer formed on a substrate, and a Group III nitride compound semiconductor layer grown epitaxially on the buffer layer. FIG. 13 shows an example in which a buffer layer 21, a Group III nitride compound semiconductor layer 22, a buffer layer 23, and a Group III nitride compound semiconductor layer 31 are sequentially formed, and the Group III nitride compound semiconductor layer 31 is etched such that the buffer layer 23 is exposed at the bottoms of the trenches. In this case, masks 4 are formed on the buffer layer 23 such that the upper surfaces of the masks 4 are positioned below the top surfaces 31a of the unetched mesas of the first Group III nitride compound semiconductor layer 31. Furthermore, a fabrication method may be such that, in a step corresponding to the step of FIG. 13A, etching is performed deeper than the thickness of the Group III nitride compound semiconductor layer 31 so that the buffer layer 21 is exposed at the bottoms of the trenches, and the masks 4 are formed on the buffer layer 21 such that the upper surfaces of the masks 4 are positioned below the top surfaces of the first Group III nitride compound semiconductor layer 31. (FIG. 14). In either case, portions of the Group III nitride compound semiconductor layer 32 formed above the bottoms of the trenches are formed primarily through lateral epitaxial growth while the Group III nitride compound semiconductor layer 31, which is the top layer of the mesas, serves as nuclei, thereby becoming regions in which threading dislocations of vertical propagation are suppressed. Other effects are similar to those described previously in relation to the case of FIG. 12.

The aforementioned modes for carrying out the invention may employ any of the following processes in arbitrary combinations.

When Group III nitride compound semiconductor layers are successively formed on a substrate, the substrate may be formed of an inorganic crystal compound such as sapphire, silicon (Si), silicon carbide (SiC), spinel ($MgAl_2O_4$), ZnO, or MgO; a Group III-V compound semiconductor such as gallium phosphide or gallium arsenide; or a Group III nitride compound semiconductor such as gallium nitride (GaN).

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to impart good crystallinity to the layer, a buffer layer is preferably formed for the purpose of compensating lattice mismatch with the sapphire substrate. When a substrate of another material is to be used, employment of a buffer layer is also preferred. A buffer layer is preferably of a Group III nitride compound semiconductor $Al_xGa_yIn_{1-x-y}N$ formed at low temperature ($0 \leq x \leq 1$, $0 \leq y \leq 1$, $0 \leq x+y \leq 1$), more preferably of $Al_xGa_{1-x}N$ ($0 \leq x \leq 1$). This buffer layer may be a single layer or a multi-component layer comprising layers of different compositions. A buffer layer may be formed at a low temperature of 380 to 420° C. or by MOCVD at a temperature of 1,000 to 1,180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200 to 600° C., more preferably 300 to 500° C., most preferably 350 to 450° C. When physical vapor deposition, such as sputtering, is employed, the thickness of a buffer layer is preferably 100 to 3,000 Å, more preferably 100 to 400 Å, most preferably 100 to 300 Å. A multi-component layer may contain, for example, alternating $Al_xGa_{1-x}N$ ($0 \leq x \leq 1$) layers and GaN layers. Alternatively, a multi-component layer may contain alternating layers of the same composition formed at a temperature of not higher than 600° C. and at a temperature of not lower than 1,000° C. Of course, these arrangements may be combined. Also, a multi-component layer may contain three or more different types of Group III nitride compound semiconductors $Al_xGa_yIn_{1-x-y}N$ ($0 \leq x \leq 1$, $0 \leq y \leq 1$, $0 \leq x+y \leq 1$). Generally, a buffer layer is amorphous and an intermediate layer is monocrystalline. Repetitions of unit of a buffer layer and an intermediate layer may be formed, and the number of repetitions is not particularly limited. The greater the number of repetitions, the greater the improvement in crystallinity.

The present invention is substantially applicable even when the composition of a buffer layer and that of a Group III nitride compound semiconductor formed on the buffer layer are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately 1/100 to 1/1,000. In the case of an underlying layer containing two or more repetitions of a buffer layer and a Group III nitride compound semiconductor layer, the Group III nitride compound semiconductor layers are further preferably doped with an element greater in atomic radius than a predominant component element. In the case where a light-emitting element is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Lateral epitaxial growth preferably progresses such that the front of lateral epitaxial growth is perpendicular to a substrate. However, lateral epitaxial growth may progress while slant facets with respect to the substrate are maintained. In this case, trenches may have a V-shaped cross section. When the front of lateral epitaxial growth is perpendicular to the substrate, the threading dislocation density of the front becomes very low, and thus crystallinity of a laterally grown region is enhanced. Meanwhile, when slant facets with respect to the substrate are maintained, the propagation direction of threading dislocations is changed and threading dislocations are generated in the laterally grown region. However, when a thick layer is formed on the laterally grown regions, threading dislocations do not propagate through the layer in the vertical direction. Therefore, the threading dislocation density of the thick layer formed on the laterally grown regions becomes low.

Preferably, lateral epitaxial growth progresses such that at least an upper portion of the front of lateral epitaxial growth is perpendicular to the surface of a substrate. More preferably, growth fronts are {11-20} planes of a Group III nitride compound semiconductor.

The depth and width of trenches to be etched may be determined such that lateral epitaxial growth fills or bridges the trenches.

When a underlying layer having a multi-layer structure is formed of AlN, $Al_xGa_{1-x}N$, or $Al_xGa_yIn_{1-x-y}N$ ($x\neq 0$) and a first Group III nitride compound semiconductor layer is formed of GaN, the layer formed of AlN, $Al_xGa_{1-x}N$, or $Al_xGa_yIn_{1-x-y}N$ ($x\neq 0$) serves favorably as a stopper layer during plasma etching involving chlorine in the form of, for example, $Cl_2$ or $BCl_3$, to thereby regulate the depth of trenches. This is also applicable when etching is performed so as to expose the top buffer layer of the underlying layer containing an arbitrary number of repetitions of a unit of a buffer layer and a Group III nitride compound semiconductor layer. Thus, there can be easily established conditions for accelerating lateral growth from the sidewalls of the first Group III nitride compound semiconductor layer while vertical growth from a mask is suppressed. Thus, the design of trenches can be facilitated, and the trenches can be rendered shallow. When the trenches are shallow, conceivably, lateral growth from the upper surface of the first Group III nitride compound semiconductor layer becomes predominant. Regardless of the depth of the trenches, lateral growth proceeds on the mask.

When the crystal orientation of a Group III nitride compound semiconductor layer to be formed on a substrate can be predicted, masking or etching in the form of stripes perpendicular to the a-plane ({11-20} plane) or the m-plane ({1-100} plane) of the Group III nitride compound semiconductor layer is favorable. The aforementioned stripe or mask patterns may be island-like or grid-like or may assume other forms. The front of lateral epitaxial growth may be perpendicular or oblique to the surface of a substrate. In order for the a-plane; i.e., the (11-20) plane, of a Group III nitride compound semiconductor layer to become the front of lateral epitaxial growth, the lateral direction of stripes must, for example, be perpendicular to the m-plane; i.e., the (1-100) plane, of the Group III nitride compound semiconductor layer. For example, when the surface of a substrate is the a-plane or the c-plane of sapphire, the m-plane of sapphire usually matches the a-plane of a Group III nitride compound semiconductor layer formed on the substrate. Thus, etching is performed according to the arrangement of the planes. In the case of a dot-like, grid-like, or island-like etching, planes that define an outline (sidewalls) are preferably {11-20} planes.

A mask may be formed of a multi-layer film formed from a polycrystalline semiconductor such as polycrystalline silicon or a polycrystalline nitride semiconductor; an oxide or a nitride, such as silicon oxide ($SiO_x$), silicon nitride ($SiN_x$), titanium oxide ($TiO_x$), or zirconium oxide ($ZrO_x$); or a metal of high melting point, such as titanium (Ti) or tungsten (W). The film may be formed through any known method, such as a vapor-growth method (e.g., deposition, sputtering, or CVD). Such a material may be employed for forming a mask used for causing the first Group III nitride compound semiconductor layer to remain. When lateral growth is performed, a mask employed during etching is removed, to thereby expose the upper surface of the first Group III nitride compound semiconductor layer.

Reactive ion etching (RIE) is preferred, but any other etching process may be employed. When trenches having sidewalls oblique to the surface of a substrate are to be formed, anisotropic etching is employed. By means of anisotropic etching, trenches are formed such that the trenches have a V-shaped cross section.

Anisotropic etching may involve undercut such that reactive ion beam etching (RIBE) proceeds beneath a hard bake resist, depending on the shape of the hard bake resist.

When a mask formed of an electrically conductive metal is etched, metal etching employing a nitric-acid-based solution may be performed. Meanwhile, the following procedure may be performed: a resist is formed merely on a top of a Group III nitride compound semiconductor; an electrically conductive metal mask is deposited on the Group III nitride compound semiconductor; and the resist and a portion of the mask that covers the resist are removed through a lift-off method, to thereby expose the top of the Group III nitride compound semiconductor.

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer assumes a multi-quantum well (MQW) structure, a single-quantum well (SQW) structure, a homo-structure, a single-hetero-structure, or a double-hetero-structure, or may be formed by means of, for example, a pin junction or a pn junction.

The aforementioned second Group III nitride compound semiconductor layer 32 in which threading dislocations are reduced may be separated from, for example, the substrate 1, the buffer layer 2, the first Group III nitride compound semiconductor layer 31, and the mask 4, to thereby form a Group III nitride compound semiconductor substrate. A Group III nitride compound semiconductor device may be formed on the resultant semiconductor substrate. The substrate may be employed for forming a larger Group III nitride compound semiconductor crystal. Removal of the substrate 1, the buffer layer 2, the layer 31, and the mask 4 may be carried out through any technique, such as mechanochemical polishing.

Embodiments of the present invention in which light-emitting elements are produced will next be described. The present invention is not limited to the embodiments described below. The present invention discloses a method for fabricating a Group III nitride compound semiconductor applicable to fabrication of any device.

The Group III nitride compound semiconductor of the present invention was produced through metal-organic vapor phase epitaxy (hereinafter called "MOVPE"). The following gasses were employed: ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$").

First Embodiment

FIGS. 1 and 2 show the steps of the present embodiment. A monocrystalline sapphire substrate 1001 containing an a-plane as a primary crystal plane was cleaned through organic cleaning and heat treatment. The temperature of the substrate 1001 was lowered to 400° C., and $H_2$ (10 L/min), $NH_3$ (5 L/min), and TMA (20 μmol/min) were fed for about three minutes, to thereby form an AlN buffer layer 1002 (thickness: about 40 nm) on the substrate 1001. Subsequently, the temperature of the sapphire substrate 1001 was maintained at 1,000° C., and $H_2$ (20 L/min), $NH_3$ (10 L/min), and TMG (300 μmol/min) were introduced, to thereby form a GaN layer 1031 (thickness: about 2 μm).

Subsequently, the GaN layer 1031 was subjected to selective dry etching by means of reactive ion beam etching (RIBE), to thereby form mesas in the form of laterally aligned triangular prisms (length of the base of the cross section of each prism: 2 μm, height of the cross section: 2 μm) (FIG. 1A). The angle formed by the base and the side of the cross section of each triangular prism was found to be about 60°. The angle formed by the base and the side of the cross section is preferably 10° to 80°, more preferably 30° to 70°. Subsequently, sputtering of tungsten (W) was performed, to thereby form a mask 1004 so as to cover the entire surface of the above-etched GaN layer 1031 (FIG. 1B).

Subsequently, in order to expose merely tops T of the laterally aligned triangular prisms (length of the base of the cross section of each prism: 2 μm, height of the cross section: 2 μm), the tungsten (W) mask 1004 was subjected to selective etching by use of a nitric-acid-based metal etching solution (FIG. 1C). Thus, the tops T (height: 0.5 μm) of the GaN layer 1031 were exposed. As an alternative method for exposing the tops T of the GaN layer 1031, the following procedure may be performed: a resist is formed on the tops T of the GaN layer 1031; a metallic mask is deposited on the GaN layer 1031; and the resist and a portion of the mask that covers the resist are removed through a lift-off method.

Subsequently, the temperature of the sapphire substrate 1001 was maintained at 1,150° C., and $H_2$ (20 L/min), $NH_3$ (10 L/min), and TMG (2 μmol/min) were introduced, to thereby grow a GaN layer 1032 through lateral epitaxial growth around the tops T (height: 0.5 μm) of the GaN layer 1031 serving as nuclei for crystal growth, i.e., seeds (FIG. 2D). Through this lateral epitaxial growth, the mask 1004 was also covered with the GaN layer 1032, and the surface of the GaN layer 1032 became flat (FIG. 2E). Thereafter, $H_2$ (20 L/min), $NH_3$ (10 L/min), and TMG (300 μmol/min) were introduced, to thereby further grow the GaN layer 1032 until the overall thickness of the GaN layer 1031 and the GaN layer 1032 became 3 μm. The threading dislocations contained in the GaN layer 1032 were considerably reduced in number as compared with those contained in the GaN layer 1031.

Second Embodiment

Figure 4A:
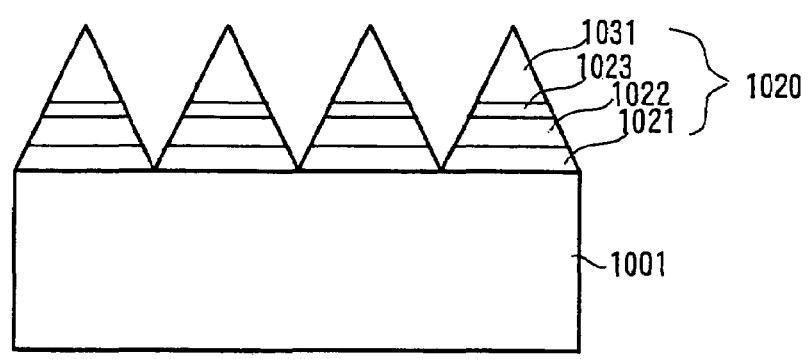
FIGS. 4A-4C are a series of cross-sectional views showing the first half of the steps of fabricating a Group III nitride compound semiconductor according to a second embodiment of the present invention.
Figure 4B:
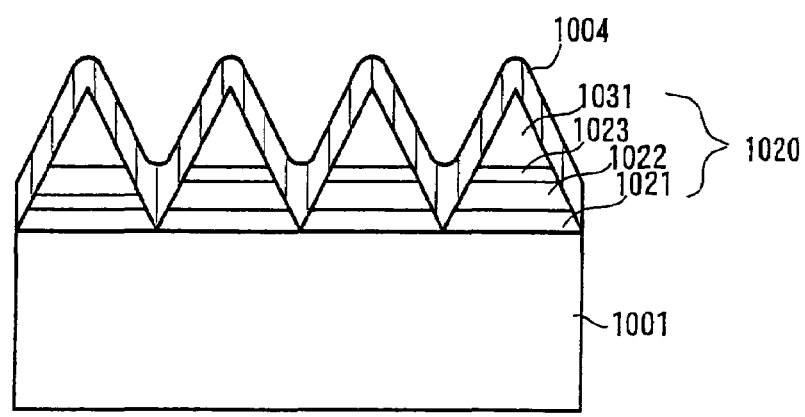
Figure 4C:
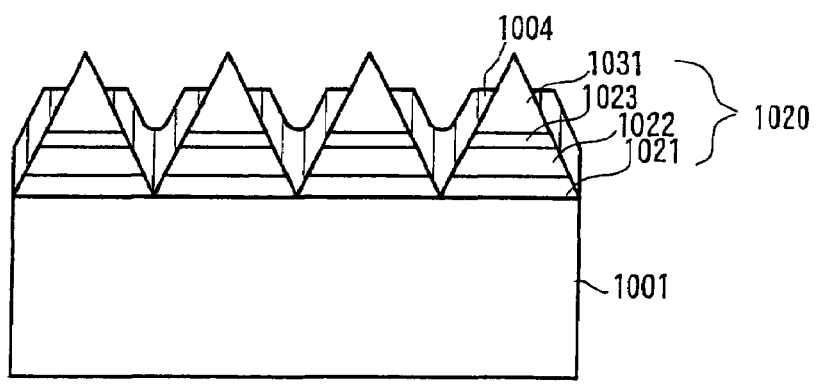
Figure 5D:
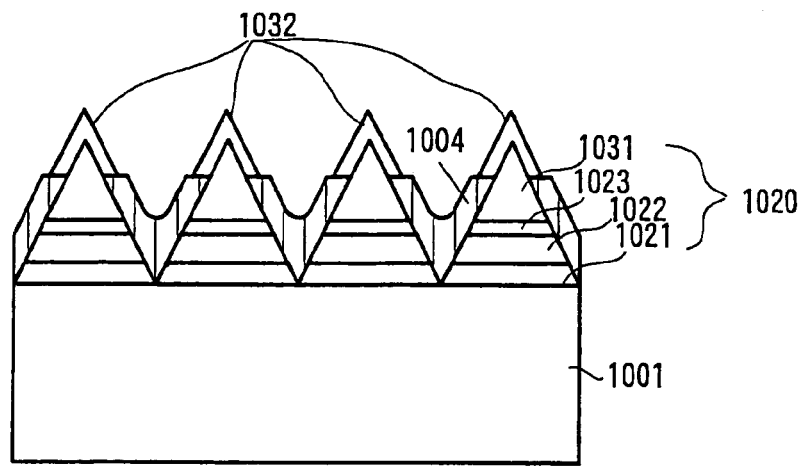
FIGS. 5D-5E are a series of cross-sectional views showing the second half of the steps of fabricating a Group III nitride compound semiconductor according to the second embodiment of the present invention.
Figure 5E:
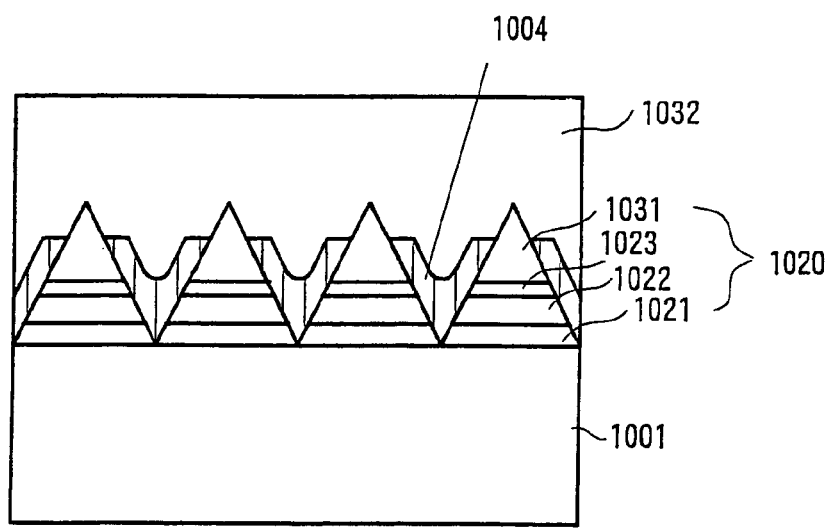

In the present embodiment, as shown in FIGS. 4 and 5, an underlying layer including multiple layers was employed. A monocrystalline sapphire substrate 1001 having an a-plane as a primary crystal plane was cleaned through organic cleaning and heat treatment. The temperature of the substrate 1001 was lowered to 400° C., and $H_2$ (10 L/min), $NH_3$ (5 L/min), and TMA (20 μmol/min) were fed for about three minutes, to thereby form a first AlN layer (first buffer layer) 1021 (thickness: about 40 nm) on the substrate 1001. Subsequently, the temperature of the sapphire substrate 1001 was maintained at 1,000C, and $H_2$ (20 L/min), $NH_3$ (10 L/min), and TMG (300 μmol/min) were introduced, to thereby form a GaN layer (intermediate layer) 1022 (thickness: about 0.3 μm). Subsequently, the temperature of the substrate 1001 was lowered to 400° C., and $H_2$ (10 L/min), $NH_3$ (5 L/min), and TMA (20 μmol/min) were fed for about three minutes, to thereby form a second AlN layer (second buffer layer) 1023 (thickness: about 40 nm). Subsequently, the temperature of the sapphire substrate 1001 was maintained at 1,000° C., and $H_2$ (20 L/min), $NH_3$ (10 L/min), and TMG (300 mmol/min) were introduced, to thereby form a GaN layer 1031 (thickness: about 1.5 μm). Thus, there was formed an underlying layer 1020 including the first AlN layer (first buffer layer) 1021 (thickness: about 40 nm), the GaN layer (intermediate layer) 1022 (thickness: about 0.3 μm), the second AlN layer (second buffer layer) 1023 (thickness: about 40 nm), and the GaN layer 1031 (thickness: about 1.5 μm). Generally, a buffer layer is amorphous and an intermediate layer is monocrystalline. A plurality of units each consisting of a buffer layer and an intermediate layer may be formed, and the number of such units is not particularly limited. The greater the number of units, the greater the improvement in crystallinity.

Subsequently, in a manner similar to that of the first embodiment, the underlying layer 1020 was subjected to etching, to thereby form mesas in the form of laterally aligned triangular prisms (length of the base of the cross section of each prism: 2 μm, height of the cross section: 1.8 μm), and a tungsten mask 1004 was formed through sputtering. Thereafter, the tungsten mask 1004 was subjected to selective etching, to thereby expose merely tops (height: 0.5 μm) of the GaN layer 1031.

Subsequently, the temperature of the sapphire substrate 1001 was maintained at 1,150° C., and $H_2$ (20 L/min), $NH_3$ (10 L/min), and TMG (2 µmol/min) were introduced, to thereby grow a GaN layer 1032 through lateral epitaxial growth around the tops (height: 0.5 µm) of the GaN layer 1031 serving as nuclei until the overall thickness of the GaN layer 1031 and the GaN layer 1032 became 3 µm. The threading dislocations contained in the GaN layer 1032 were considerably reduced in number as compared with those contained in the GaN layer 1031.

Third Embodiment

In the present embodiment, the first embodiment was modified such that, in formation of the GaN layer 1031, the GaN layer 1031 was doped with TMI to become a GaN:In layer 1031. The doping amount of indium (In) was regulated to about $1\times10^{16}/cm^3$. Subsequently, in a manner substantially similar to that of the first embodiment, etching was performed; a tungsten mask 1004 was formed; the GaN:In layer 1031 was subjected to selective etching to thereby expose tops of the layer 1031; and lateral epitaxial growth of GaN was performed. The threading dislocations contained in a GaN layer 1032 which was laterally grown on the GaN:In layer 1031 serving as nuclei for crystal growth were slightly reduced in number as compared with those contained in the GaN layer 1032 formed in the first embodiment.

Fourth Embodiment

Figure 6:
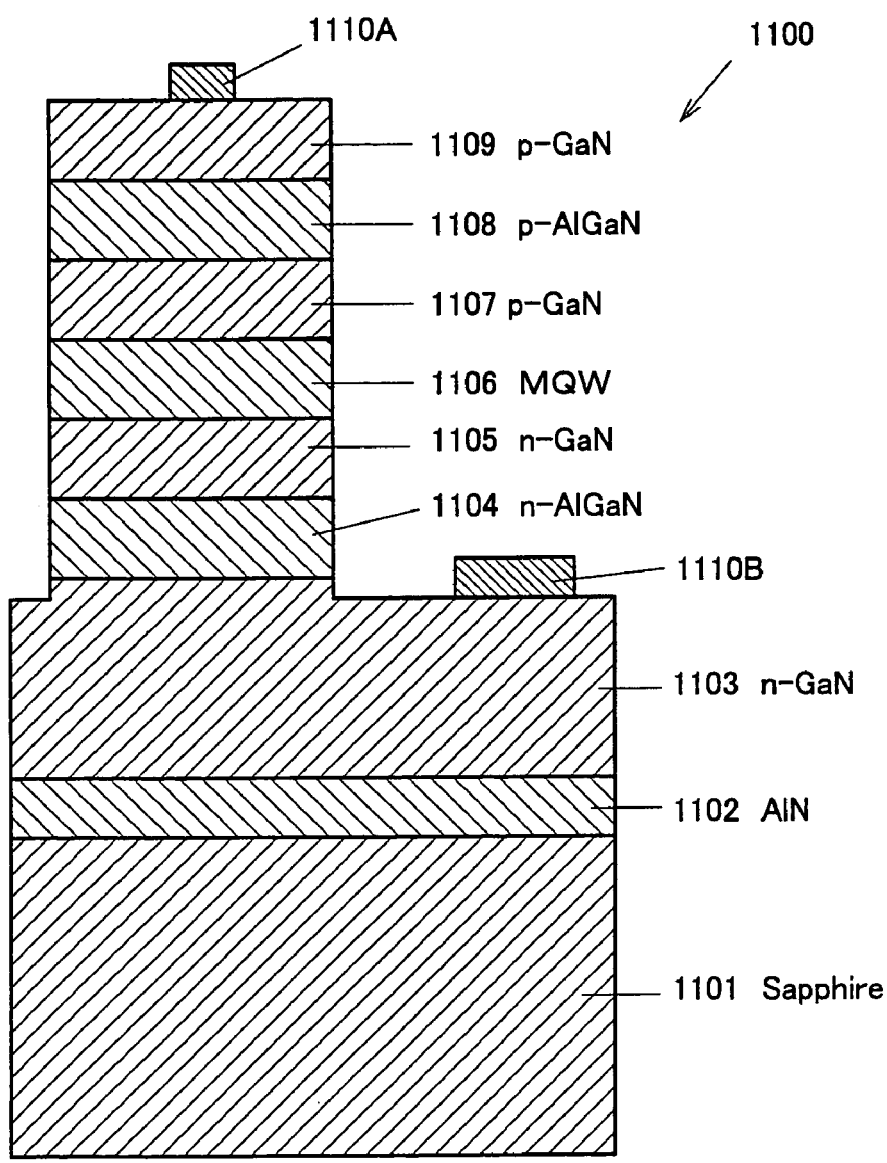
FIG. 6 is a cross-sectional view showing the structure of a Group III nitride compound semiconductor light-emitting element according to a fourth embodiment of the present invention.

On a wafer formed in a manner similar to that of the first embodiment, a laser diode (LD) 1100 shown in FIG. 6 was formed in the following manner. Notably, in formation of the GaN layer 1032, silane (SiH$_4$) was introduced so as to form a silicon (Si)-doped n-type GaN layer serving as the GaN layer 1032. For the sake of simplified illustration, the drawing merely illustrates a GaN layer 1103 to inclusively represent the GaN layer 1031, the tungsten mask 4, and the GaN layer 1032.

On a wafer including a sapphire substrate 1101, an AlN buffer layer 1102, and the GaN layer 1103 consisting of a GaN layer, a tungsten mask, and an n-type GaN layer, a silicon (Si)-doped Al$_{0.08}$Ga$_{0.92}$N n-cladding layer 1104, a silicon (Si)-doped GaN n-guide layer 1105, an MQW-structured light-emitting layer 1106, a magnesium (Mg)-doped GaN p-guide layer 1107, a magnesium (Mg)-doped Al$_{0.08}$Ga$_{0.92}$N p-cladding layer 1108, and a magnesium (Mg)-doped GaN p-contact layer 1109 were formed. Subsequently, an electrode 1110A of gold (Au) was formed on the p-contact layer 1109. Etching was partially performed until the two-layered GaN layer 1103 consisting of the GaN layer and the n-type GaN layer was exposed. On the exposed GaN layer 1103, an electrode 1110B of aluminum (Al) was formed. An essential portion of the laser diode (LD) 1100 was formed atop the lateral epitaxial growth regions of the GaN layer 1103; i.e., atop the regions where threading dislocation is suppressed. The thus-formed laser diode (LD) 1100 exhibited significant improvement of service life and light-emitting efficiency.

Fifth Embodiment

Figure 7:
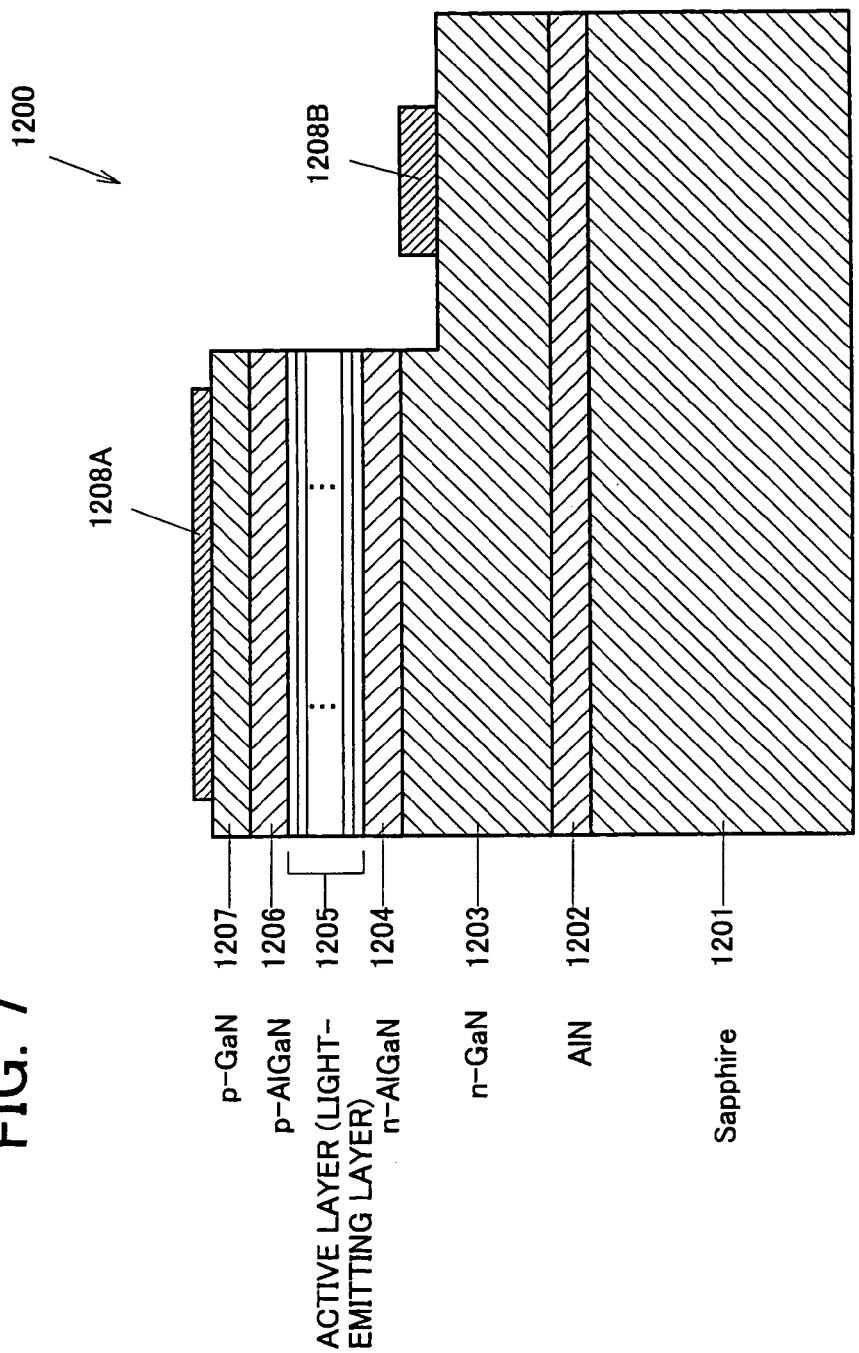
FIG. 7 is a cross-sectional view showing the structure of a Group III nitride compound semiconductor light-emitting element according to a fifth embodiment of the present invention.

On a wafer formed in a manner similar to that of the first embodiment, a light-emitting diode (LED) 1200 shown in FIG. 7 was formed in the following manner. Notably, in formation of the GaN layer 1032, silane (SiH$_4$) was introduced so as to form a silicon (Si)-doped n-type GaN layer serving as the GaN layer 1032. For the sake of simplified illustration, the drawing merely illustrates a GaN layer 1203 to inclusively represent the GaN layer 1031, the tungsten mask 1004, and the GaN layer 1032.

On a wafer including a sapphire substrate 1201, an AlN buffer layer 1202, and the GaN layer 1203 consisting of a GaN layer, a tungsten mask, and an n-type GaN layer, a silicon (Si)-doped Al$_{0.08}$Ga$_{0.92}$N n-cladding layer 1204, a light-emitting layer 1205, a magnesium (Mg)-doped Al$_{0.08}$Ga$_{0.92}$N p-cladding layer 1206, and a magnesium (Mg)-doped GaN p-contact layer 1207 were formed. Subsequently, an electrode 12.08A of gold (Au) was formed on the p-contact layer 1207. Etching was partially performed until the two-layered GaN layer 1203 consisting of the GaN layer and the n-type GaN layer was exposed. On the exposed GaN layer 1203, an electrode 1208B of aluminum (Al) was formed. The thus-formed light-emitting diode (LED) 1200 exhibited significant improvement of service life and light-emitting efficiency.

Sixth Embodiment

Figure 8A:
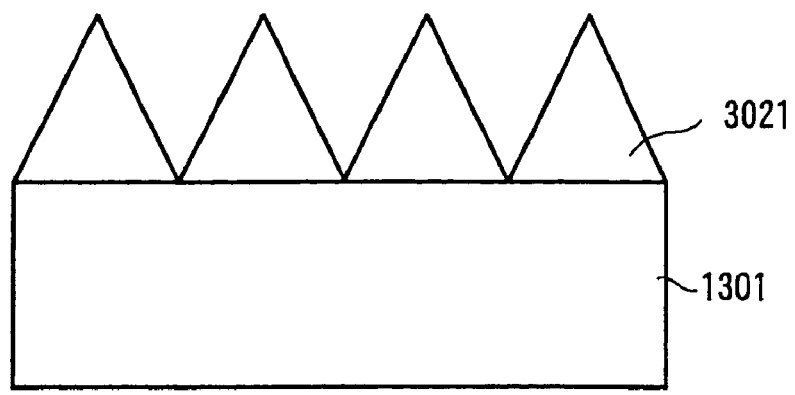
FIGS. 8A-8C are a series of cross-sectional views showing the first half of the steps of fabricating a Group III nitride compound semiconductor light-emitting element according to a sixth embodiment of the present invention.
Figure 8B:
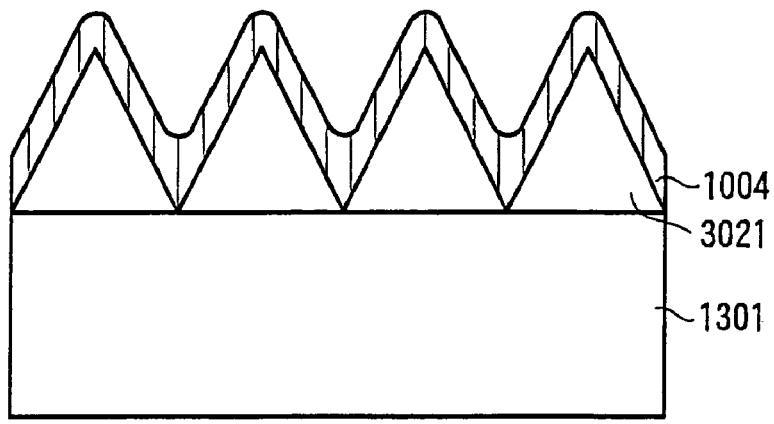
Figure 8C:
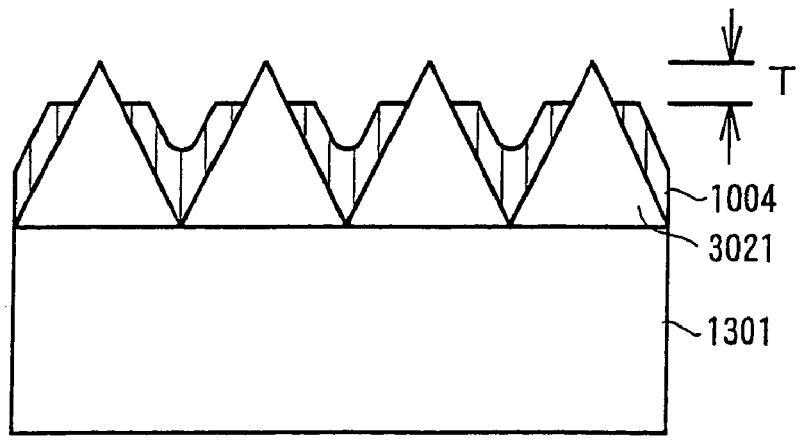
Figure 9D:
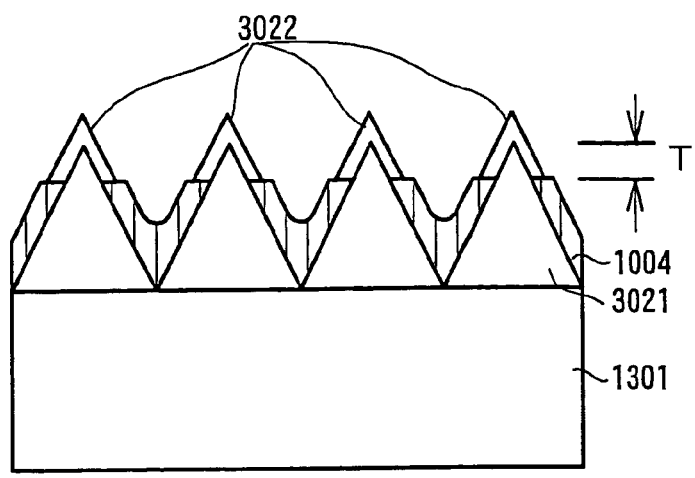
FIGS. 9D-9E are a series of cross-sectional views showing the second half of the steps of fabricating a Group III nitride compound semiconductor light-emitting element according to the sixth embodiment of the present invention.
Figure 9E:
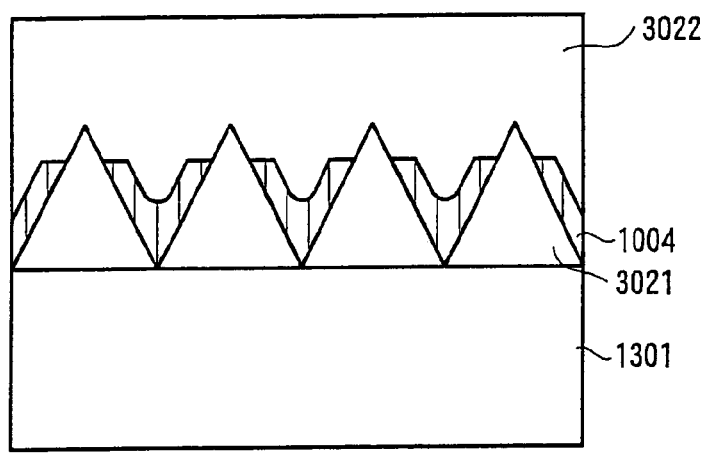

In the present embodiment, as shown in FIGS. 8 and 9, an n-type silicon (Si) substrate was employed. On an n-type silicon (Si) substrate 1301, a silicon (Si)-doped Al$_{0.15}$Ga$_{0.85}$N layer 3021 (thickness: 2 µm) was formed at a temperature of 1,150° C. through feeding of H$_2$ (10 L/min), NH$_3$ (10 L/min), TMG (100 µmol/min), TMA (10 µmol/min), and silane (SiH$_4$) diluted with H$_2$ gas to 0.86 ppm (0.2 µmol/min). Subsequently, the Al$_{0.15}$Ga$_{0.85}$N layer 3021 was subjected to selective dry etching by means of reactive ion beam etching (RIBE), to thereby form mesas or poles in the form of laterally aligned triangular prisms (length of the base of the cross section of each prism: 2 µm, height of the cross section: 2 µm). Thereafter, in a manner similar to that of the first embodiment, a tungsten mask 1004 was formed, and selective etching was performed, to thereby expose tops (height: 0.5 µm) of the Al$_{0.15}$Ga$_{0.85}$N layer 3021.

Subsequently, while the temperature of the n-type silicon substrate 1301 was maintained at 1,150° C., H$_2$ (20 L/min), NH$_3$ (10 L/min), TMG (2 µmol/min), TMA (0.2 µmol/min), and silane (SiH$_4$) diluted with H$_2$ gas (4 µmol/min) were introduced, to thereby form an n-Al$_{0.15}$Ga$_{0.85}$N layer 3022 through lateral epitaxial growth around the tops (height: 0.5 µm) of the n-Al$_{0.15}$Ga$_{0.85}$N layer 3021 serving as nuclei for crystal growth. Through this lateral epitaxial growth, the mask 1004 was covered with the n-Al$_{0.15}$Ga$_{0.85}$N layer 3022, and the surface of the layer 3022 became flat. Thereafter, H$_2$ (10 L/min), NH$_3$ (10 L/min), TMG (100 µmol/min), TMA (10 µmol/min), and silane (SiH$_4$) diluted with H$_2$ gas (0.2 µmol/min) were fed, to thereby further grow the n-Al$_{0.15}$Ga$_{0.85}$N layer 3022 until the overall thickness of the n-Al$_{0.15}$Ga$_{0.85}$N layer 3021 and the n-Al$_{0.15}$Ga$_{0.85}$N layer 3022 became 3 µm. Hereinafter, the n-Al$_{0.15}$Ga$_{0.85}$N layer 3021, the tungsten mask 1004, and the n-Al$_{0.15}$Ga$_{0.85}$N layer 3022 (overall thickness: 3 µm) are inclusively represented by an n-Al$_{0.15}$Ga$_{0.85}$N layer 1302.

Figure 10:
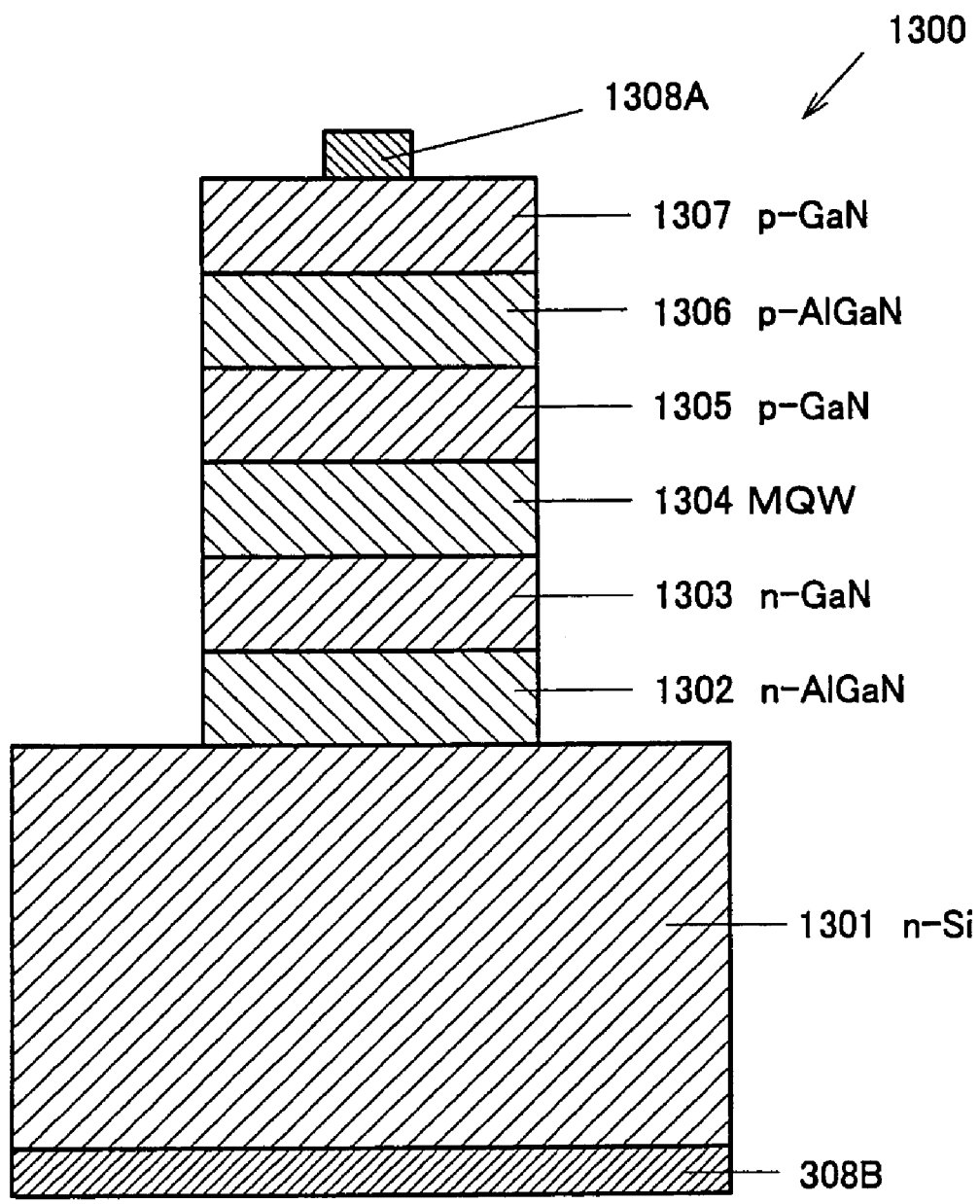
FIG. 10 is a cross-sectional view showing the structure of a Group III nitride compound semiconductor light-emitting element according to the sixth embodiment of the present invention.

As shown in FIG. 10, on the n-Al$_{0.15}$Ga$_{0.85}$N layer 1302 formed on the n-type silicon substrate 1301, a silicon (Si)-doped GaN n-guide layer 1303, an MQW-structured light-emitting layer 1304, a magnesium (Mg)-doped GaN p-guide layer 1305, a magnesium (Mg)-doped Al$_{0.08}$Ga$_{0.92}$N p-cladding layer 1306, and a magnesium (Mg)-doped GaN p-contact layer 1307 were formed. Subsequently, an electrode 1308A of gold (Au) was formed on the p-contact layer 1307, and an electrode 1308B of aluminum (Al) was formed on the back side of the silicon substrate 1301 (FIG. 10). An essential portion of a laser diode (LD) 1300 was formed atop the lateral epitaxial growth regions of the n-Al$_{0.15}$Ga$_{0.85}$N layer 1302; i.e., atop the regions where threading dislocation is suppressed. The thus-formed laser diode (LD) 1300 exhibited significant improvement of service life and light-emitting efficiency.

Seventh Embodiment

Figure 11:
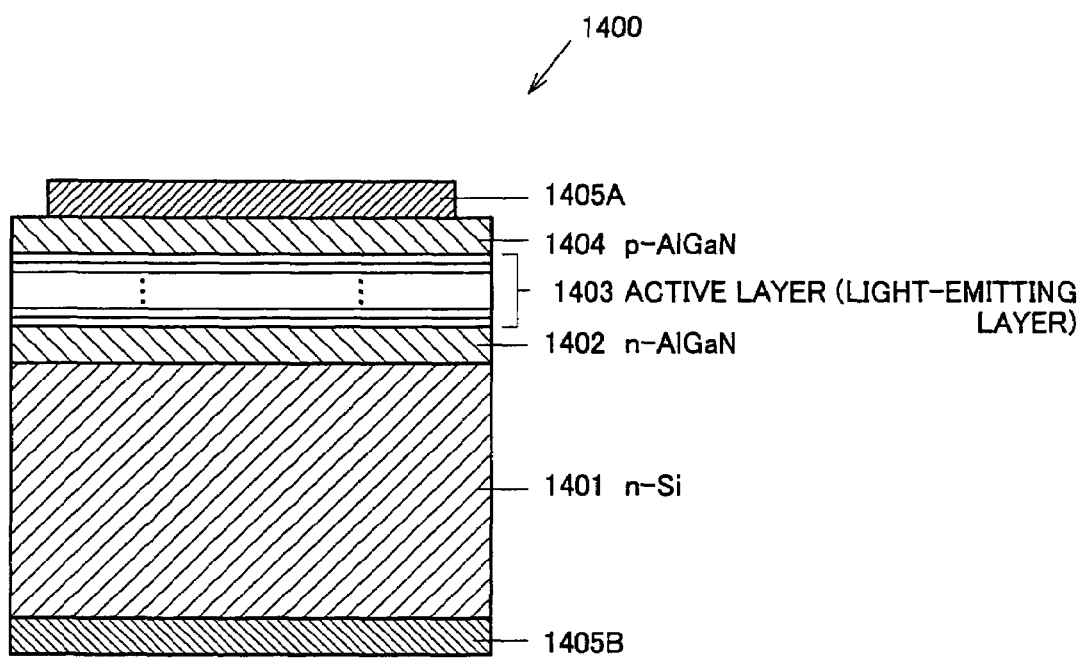
FIG. 11 is a cross-sectional view showing the structure of a Group III nitride compound semiconductor light-emitting element according to a seventh embodiment of the present invention.

In the present embodiment, an n-type silicon (Si) substrate was employed. As in the sixth embodiment which employed a wafer including the n-type silicon substrate 1301 and the n-Al$_{0.15}$Ga$_{0.85}$N layer 1302 formed thereon, the present embodiment prepared a wafer including an n-type silicon substrate 1401 and an n-Al$_{0.15}$Ga$_{0.85}$N layer 1402 formed on the substrate 1401. On the wafer, a light-emitting layer 1403 and a magnesium (Mg)-doped Al$_{0.15}$Ga$_{0.85}$N p-cladding layer 1404 were formed. Subsequently, an electrode 1405A of gold (Au) was formed on the p-cladding layer 1404, and an electrode 1405B of aluminum (Al) was formed on the back side of the silicon substrate 1401 (FIG. 11). The thus-formed light-emitting diode (LED) 1400 exhibited significant improvement of service life and light-emitting efficiency.

[Modification of Etching]

Figure 3A:
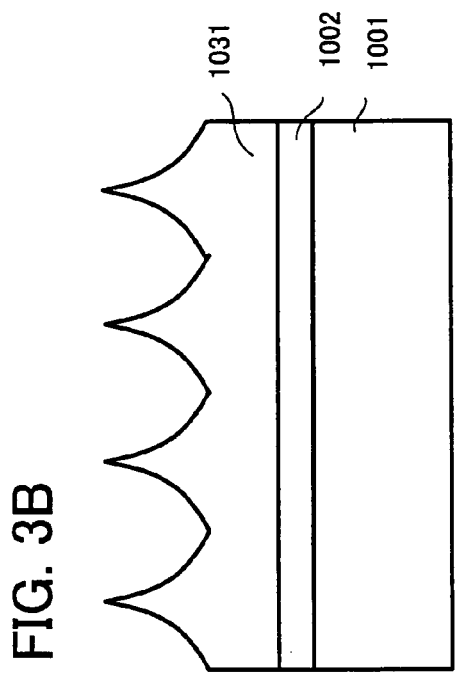
FIGS. 3A and 3B are cross-sectional views showing examples of etched Group III nitride compound semiconductor layers.
Figure 3B:
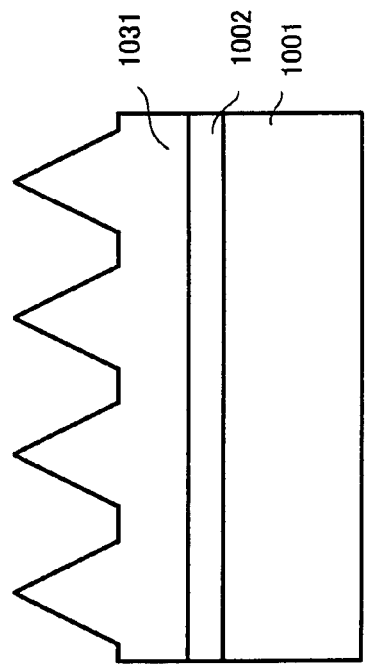
Figure 3C:
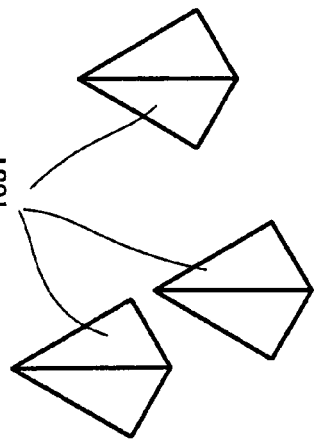
FIGS. 3C and 3D are perspective views showing examples of etched Group III nitride compound semiconductor layers.
Figure 3D:
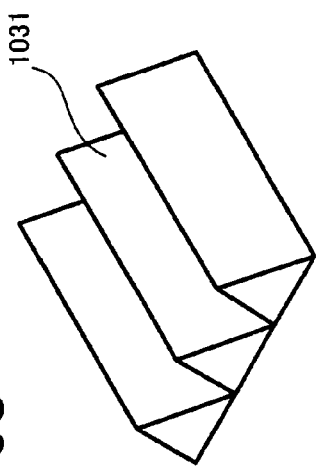

As shown in FIG. 3A, etching may be performed such that trenches having flat bottom surfaces are formed. Alternatively, as shown in FIG. 3B, etching may be performed such that mesas having curved sidewalls are formed.

Eighth Embodiment

FIG. 12 shows the steps of the present embodiment. A monocrystalline sapphire substrate 1 having an a-plane as a primary crystal plane was cleaned through organic cleaning and heat treatment. The temperature of the substrate 1 was lowered to 400° C., and H$_2$ (10 L/min), NH$_3$ (5 L/min), and TMA (20 μmol/min) were fed for about three minutes, to thereby form an AlN buffer layer 2 (thickness: about 40 nm) on the substrate 1. Subsequently, the temperature of the sapphire substrate 1 was maintained at 1,000° C., and H$_2$ (20 L/min), NH$_3$ (10 L/min), and TMG (300 μmol/min) were introduced, to thereby form a GaN layer 31 (thickness: about 0.5 μm).

By use of a hard bake resist mask, stripe-shaped trenches each having a width of 10 μm and a depth of 0.5 μm were selectively dry-etched at intervals of 10 μm by means of reactive ion etching (RIE). As a result, mesas of the GaN layer 31 each having a width of 10 μm and a height of 0.5 μm, and trenches each having a width of 10 μm and having the substrate 1 exposed at the bottom thereof were alternately formed (FIG. 12A). At this time, the {11-20} planes of the GaN layer 31 were caused to serve as the sidewalls of the trenches of a depth of 0.5 μm.

Subsequently, a silicon dioxide (SiO$_2$) film was uniformly formed through sputtering. Thereafter, a resist was applied onto the SiO$_2$ film; a portion of the resist that covered a necessary portion of the silicon dioxide film was caused to remain through photolithography; and a portion of the silicon dioxide film that was not covered with the resist was subjected to wet etching, to thereby form a wafer having the structure shown in FIG. 12A.

Subsequently, while the temperature of the sapphire substrate 1 was maintained at 1,150° C., H$_2$ (20 L/min), NH$_3$ (10 L/min), and TMG (2 μmol/min) were introduced, to thereby form a GaN layer 32 through lateral epitaxial growth performed while the sidewalls of the trenches of a depth of 0.5 μm; i.e., the {11-20} planes of the GaN layer 31, served as nuclei. At this time, virtually no vertical growth progressed from the top surfaces of the mesas, and no vertical growth progressed from masks 4 provided at the bottoms of the trenches (FIG. 12B). Lateral epitaxial growth was performed while the {11-20} planes primarily served as the growth fronts, whereby the trenches were filled or a bridged structure having micro spaces was provided between the GaN layer 32 and the mask 4, and the surface of the GaN layer 32 become flat (FIG. 12C). Thereafter, H$_2$ (20 L/min), NH$_3$ (10 L/min), and TMG (300 μmol/min) were introduced, to thereby further grow the GaN layer 32 until the overall thickness of the GaN layer 31 and the GaN layer 32 became 3 μm. In contrast to portions of the GaN layer 32 formed above the top surfaces of the mesas, portions of the GaN layer 32 formed above the bottoms of the trenches extending as deep as 0.5 μm through the GaN layer 31 exhibited significant suppression of threading dislocations.

Ninth Embodiment

In the present embodiment, as shown in FIG. 13, an underlying layer including multiple layers was employed. A monocrystalline sapphire substrate 1 having an a-plane as a primary crystal plane was cleaned through organic cleaning and heat treatment. The temperature of the substrate 1 was lowered to 400° C., and H$_2$ (10 L/min), NH$_3$ (5 L/min), and TMA (20 μmol/min) were fed for about three minutes, to thereby form a first AlN layer (first buffer layer) 21 (thickness: about 40 nm) on the substrate 1. Subsequently, the temperature of the sapphire substrate 1 was maintained at 1,000° C., and H$_2$ (20 L/min), NH$_3$ (10 L/min), and TMG (300 μmol/min) were introduced, to thereby form a GaN layer (intermediate layer) 22 (thickness: about 0.3 μm). Subsequently, the temperature of the substrate 1 was lowered to 400° C., and H$_2$ (10 L/min), NH$_3$ (5 L/min), and TMA (20 μmol/min) were fed for about three minutes, to thereby form a second AlN layer (second buffer layer) 23 (thickness: about 40 nm). Subsequently, the temperature of the sapphire substrate 1 was maintained at 1,000° C., and H$_2$ (20 L/min), NH$_3$ (10 L/min), and TMG (300 μmol/min) were introduced, to thereby form a GaN layer 31 (thickness: about 0.5 μm). Thus, there was formed an underlying layer 20 including the first AlN layer (first buffer layer) 21 (thickness: about 40 nm), the GaN layer (intermediate layer) 22 (thickness: about 0.3 μm), the second AlN layer (second buffer layer) 23 (thickness: about 40 nm), and the GaN layer 31 (thickness: about 0.5 μm). Generally, a buffer layer is amorphous and an intermediate layer is monocrystalline. A plurality of units each consisting of a buffer layer and an intermediate layer may be formed, and the number of such units is not particularly limited. The greater the number of units, the greater the improvement in crystallinity.

Subsequently, by use of a hard bake resist mask, stripe-shaped trenches each having a width of 10 μm and a depth of 0.5 μm were selectively dry-etched at intervals of 10 μm by means of reactive ion etching (RIE). As a result, mesas of the GaN layer 31 each having a width of 10 μm and a height of 0.5 μm, and trenches each having a width of 10 μm and having the second AlN layer 23 exposed at the bottom thereof were alternately formed (FIG. 13). At this time, the {11-20} planes of the GaN layer 31 were caused to serve as the sidewalls of the trenches of a depth of 0.5 μm.

Subsequently, in a manner similar to that of the first embodiment, masks 4 were formed on the second AlN layer 23 such that the upper surfaces of the masks 4 were positioned below the top surface of the GaN layer 31.

Subsequently, while the temperature of the sapphire substrate 1 was maintained at 1,150° C., H$_2$ (20 L/min), NH$_3$ (10 L/min), and TMG (2 μmol/min) were introduced, to thereby form a GaN layer 32 through lateral epitaxial growth performed while the sidewalls of the trenches of a depth of 0.5 μm; i.e., the {11-20} planes of the GaN layer 31, served as nuclei for crystal growth. At this time, virtually no vertical growth progressed from the top surfaces of the mesas, and no vertical growth progressed from the masks 4 provided at the bottoms of the trenches. Lateral epitaxial growth was performed while the {11-20} planes primarily served as the growth fronts, whereby the trenches were filled or a lateral growth region having a bridge structure was provided, and the surface of the GaN layer 32 become flat. Thereafter, H$_2$ (20 L/min), NH$_3$ (10 L/min), and TMG (300 μmol/min) were introduced, to thereby further grow the GaN layer 32 until the overall thickness of the GaN layer 31 and the GaN layer 32 became 3 μm. In contrast to portions of the GaN layer 32 formed above the top surfaces of the mesas, portions of the GaN layer 32 formed above the bottoms of the trenches extending as deep as 0.5 μm through the GaN layer 31 exhibited significant suppression of threading dislocations.

Tenth Embodiment

In the present embodiment, in a manner similar to that of the ninth embodiment, an underlying layer 20 including a first AlN layer (first buffer layer) 21 (thickness: about 40 nm), a GaN layer (intermediate layer) 22 (thickness: about 0.3 μm), a second AlN layer (second buffer layer) 23 (thickness: about 40 nm), and a GaN layer 31 (thickness: about 0.5 μm) was formed on a sapphire substrate 1. Subsequently, etching to a depth of about 0.8 μm was performed to thereby alternately form mesas each having a width of 10 μm and a height of 0.8 μm and having the GaN layer 31 as the top layer, and trenches each having a width of 10 μm and having the first AlN layer 21 exposed at the bottom thereof (FIG. 14). At this time, the {11-20} planes of the GaN layer 31, the second AlN layer (second buffer layer) 23, and the GaN layer (intermediate layer) 22 were caused to serve as the sidewalls of the trenches of a depth of 0.8 μm. Masks 4 were formed on the first AlN layer 21 such that the upper surfaces of the masks 4 were positioned below the top surface of the GaN layer 31. As in the second embodiment, lateral epitaxial growth was performed while the {11-20} planes primarily served as the growth fronts, thereby establishing a flat top surface. Subsequently, the GaN layer 32 was grown such that the overall thickness of the GaN layer 31 and the GaN layer 32 became 3 μm. In contrast to portions of the GaN layer 32 formed above the top surfaces of the mesas, portions of the GaN layer 32 formed above the masks 4 provided at the bottoms of the trenches extending as deep as about 0.8 μm through the GaN layer 31, the second AlN layer (second buffer layer) 23, and the GaN layer (intermediate layer) 22 exhibited significant suppression of threading dislocation.

Eleventh Embodiment

Figure 15A:
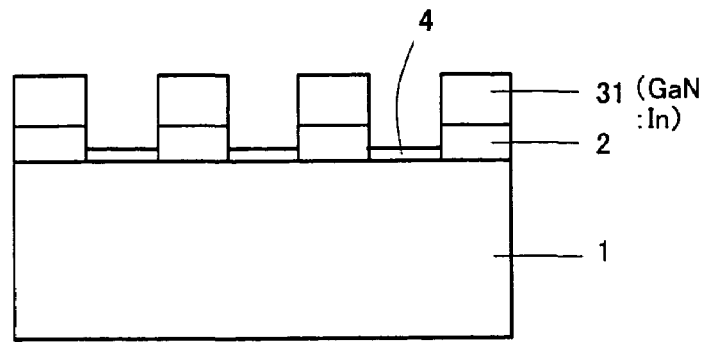
FIGS. 15A-15C are a series of cross-sectional views showing the steps of fabricating a Group III nitride compound semiconductor according to an eleventh embodiment of the present invention.
Figure 15B:
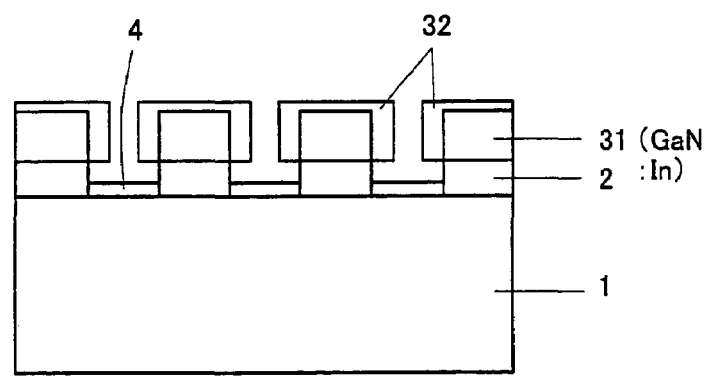
Figure 15C:
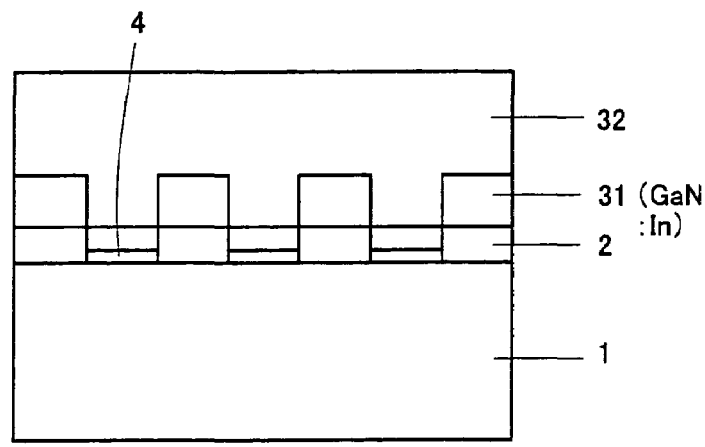

In the present embodiment, the eighth embodiment was modified such that, in formation of the GaN layer 31, the GaN layer 31 was doped with TMI to become a GaN:In layer 31. The doping amount of indium (In) was regulated to about 1×10$^{16}$/cm$^3$. Subsequently, etching and lateral epitaxial growth of GaN were performed in a manner substantially similar to that of the first embodiment (FIG. 15). The threading dislocations contained in a GaN layer 32 which was laterally grown on the GaN:In layer 31 serving as a nucleus for crystal growth were slightly reduced in number as compared with those contained in the GaN layer 1032 formed in the first embodiment. Portions of the GaN layer 32 grown vertically above the GaN:In layer 31 exhibited threading dislocations reduced to about 1/100 those contained in the GaN layer 1032 formed in the first embodiment.

Twelfth Embodiment

Figure 16:
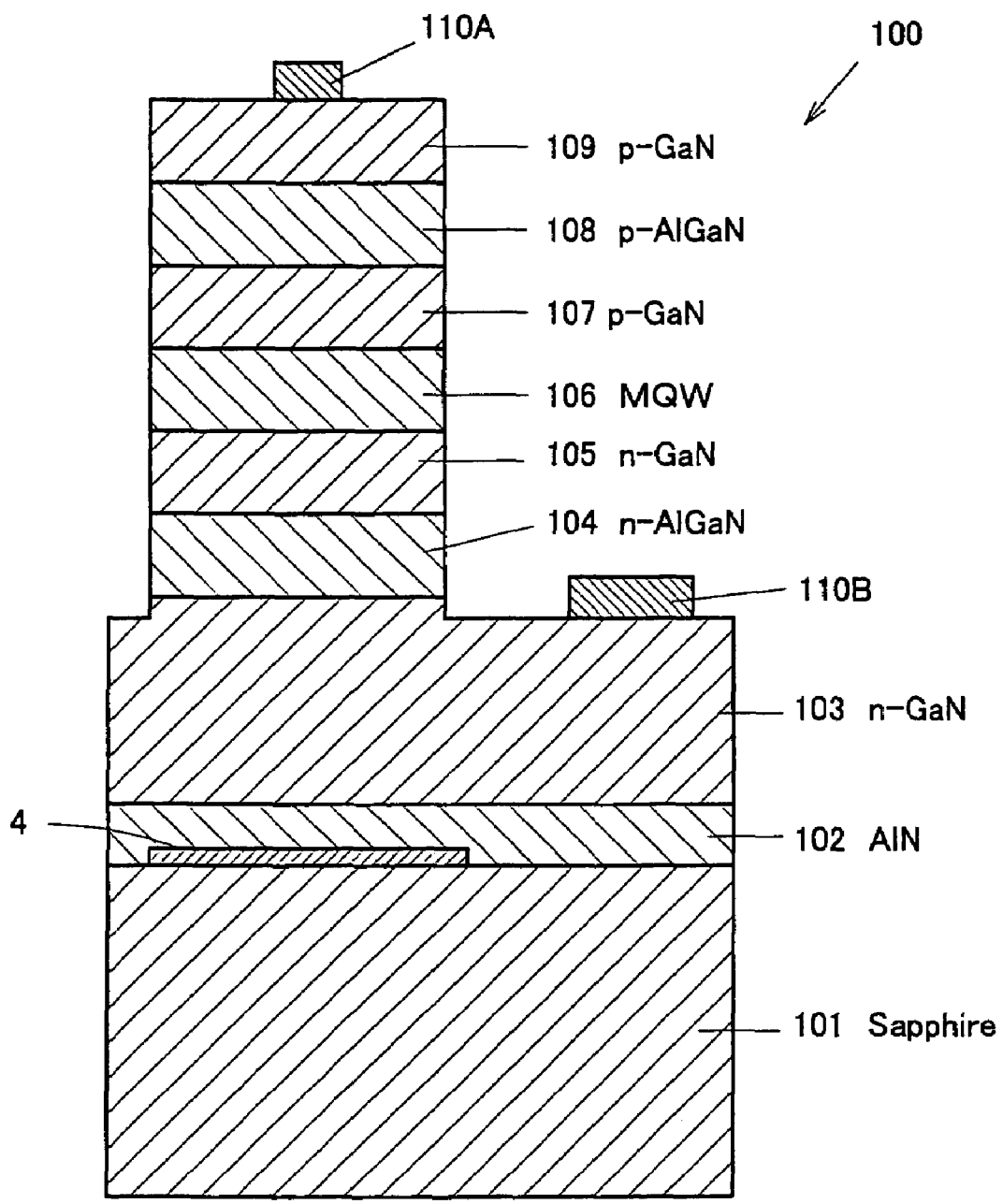
FIG. 16 is a cross-sectional view showing the structure of a Group III nitride compound semiconductor light-emitting element according to a twelfth embodiment of the present invention.

On a lateral growth region of a wafer formed in a manner similar to that of the eighth embodiment, a laser diode (LD) 100 shown in FIG. 16 was formed in the following manner. Notably, in formation of the GaN layer 32, silane (SiH$_4$) was introduced so as to form a silicon (Si)-doped n-type GaN layer serving as the GaN layer 32. For the sake of simplified illustration, the drawing merely illustrates a GaN layer 103 to inclusively represent the GaN layer 31 and the GaN layer 32.

On a wafer including a sapphire substrate 101, an AlN buffer layer 102, and the two-layered GaN layer 103 consisting of a GaN layer and an n-type GaN layer, a silicon (Si)-doped Al$_{0.08}$Ga$_{0.92}$N n-cladding layer 104, a silicon (Si)-doped GaN n-guide layer 105, an MQW-structured light-emitting layer 106, a magnesium (Mg)-doped GaN p-guide layer 107, a magnesium (Mg)-doped Al$_{0.08}$Ga$_{0.92}$N p-cladding layer 108, and a magnesium (Mg)-doped GaN p-contact layer 109 were formed. Subsequently, an electrode 110A of gold (Au) was formed on the p-contact layer 109. Etching was partially performed until the two-layered GaN layer 103 consisting of the GaN layer and the n-type GaN layer was exposed. On the exposed GaN layer 103, an electrode 110B of aluminum (Al) was formed. An essential portion of the laser diode (LD) 100 was formed atop the lateral epitaxial growth regions of the GaN layer 103; i.e., atop the regions where threading dislocation is suppressed. The thus-formed laser diode (LD) 100 exhibited significant improvement of service life and light-emitting efficiency.

Thirteenth Embodiment

Figure 17:
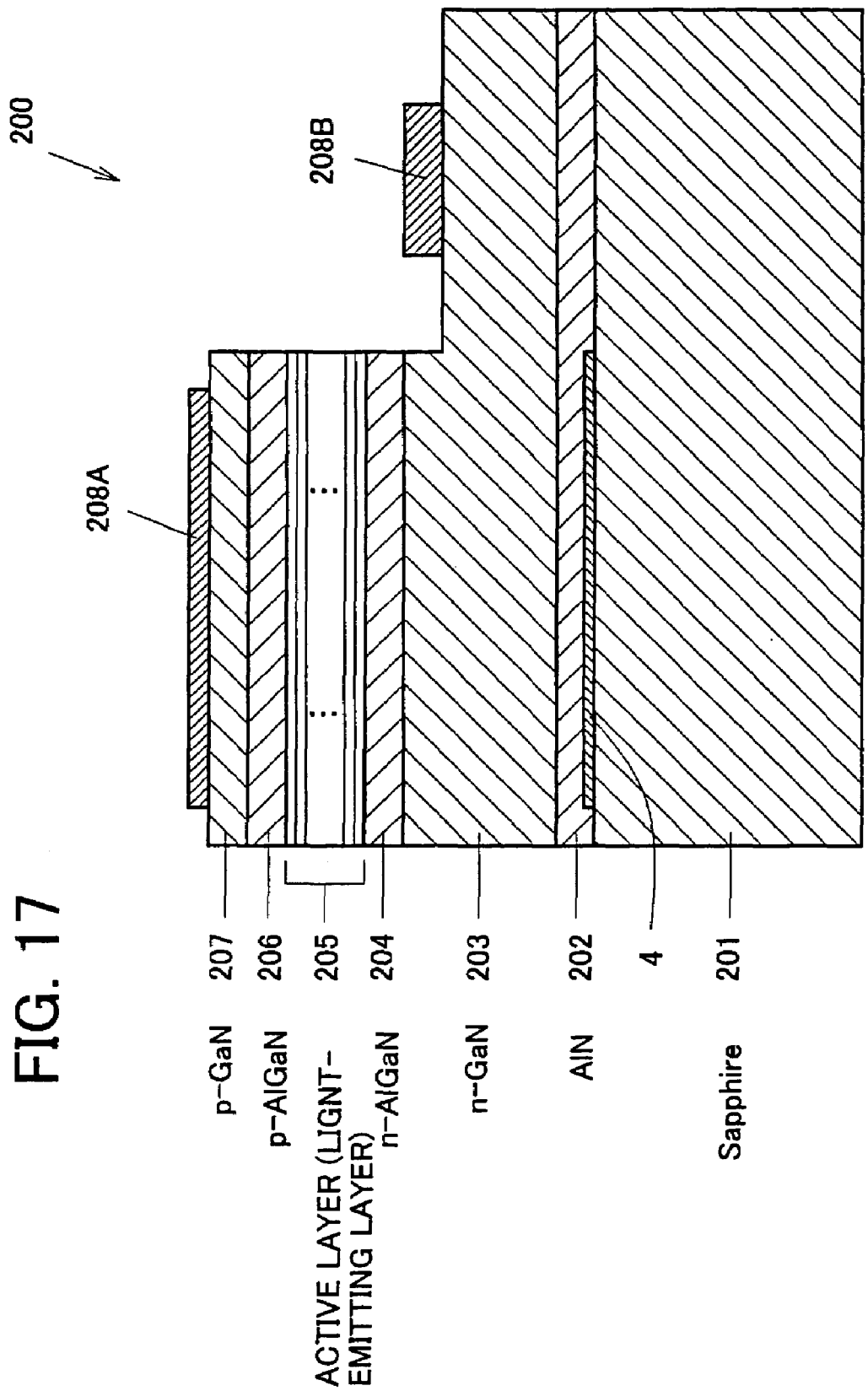
FIG. 17 is a cross-sectional view showing the structure of a Group III nitride compound semiconductor light-emitting element according to a thirteenth embodiment of the present invention.

On a lateral growth region of a wafer formed in a manner similar to that of the eighth embodiment, a light-emitting diode (LED) 200 shown in FIG. 17 was formed in the following manner. Notably, in formation of the GaN layer 32, silane (SiH$_4$) was introduced so as to form a silicon (Si)-doped n-type GaN layer serving as the GaN layer 32. For the sake of simplified illustration, the drawing merely illustrates a GaN layer 203 to inclusively represent the GaN layer 31 and the GaN layer 32.

On a wafer including a sapphire substrate 201, an AlN buffer layer 202, and the two-layered GaN layer 203 consisting of a GaN layer and an n-type GaN layer, a silicon (Si)-doped Al$_{0.08}$Ga$_{0.92}$N n-cladding layer 204, a light-emitting layer 205, a magnesium (Mg)-doped Al$_{0.08}$Ga$_{0.92}$N p-cladding layer 206, and a magnesium (Mg)-doped GaN p-contact layer 207 were formed. Subsequently, an electrode 208A of gold (Au) was formed on the p-contact layer 207. Etching was partially performed until the two-layered GaN layer 203 consisting of the GaN layer and the n-type GaN layer was exposed. On the exposed GaN layer 203, an electrode 208B of aluminum (Al) was formed. The thus-formed light-emitting diode (LED) 200 exhibited significant improvement of service life and light-emitting efficiency.

Fourteenth Embodiment

Figure 18A:
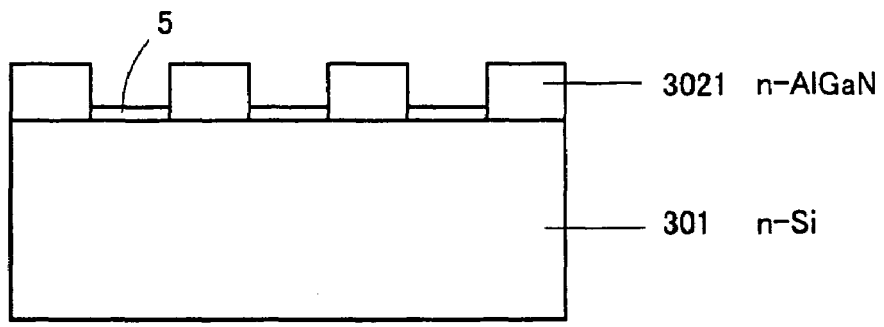
FIGS. 18A-18C are a series of cross-sectional views partially showing the steps of fabricating a Group III nitride compound semiconductor light-emitting element according to a fourteenth embodiment of the present invention.

In the present embodiment, an n-type silicon (Si) substrate was employed. On an n-type silicon (Si) substrate 301, a silicon (Si)-doped Al$_{0.15}$Ga$_{0.85}$N layer 3021 (thickness: 0.5 μm) was formed at a temperature of 1,150° C. through feeding of H$_2$ (10 L/min), NH$_3$ (10 L/min), TMG (100 μmol/min), TMA (10 μmol/min), and silane (SiH$_4$) diluted with H$_2$ gas to 0.86 ppm (0.2 μmol/min). Subsequently, by use of a hard bake resist mask, stripe-shaped trenches each having a width of 10 μm and a depth of 0.5 μm were selectively dry-etched at intervals of 10 μm by means of reactive ion etching (RIE). As a result, mesas of the n-Al$_{0.15}$Ga$_{0.85}$N layer 3021 each having a width of 10 μm and a height of 0.5 μm, and trenches each having a width of 10 μm and having the n-type silicon substrate 301 exposed at the bottom thereof were alternately formed (FIG. 18A). At this time, the {11-20} planes of the n-Al$_{0.15}$Ga$_{0.85}$N layer 3021 were caused to serve as the sidewalls of the trenches of a depth of 0.5 μm.

Figure 18B:
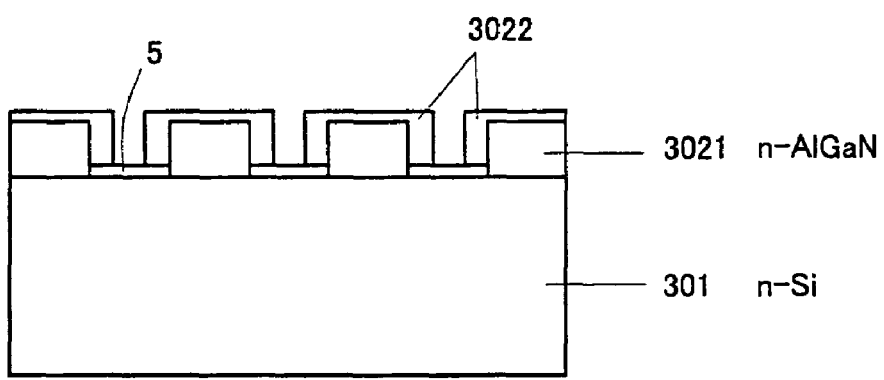
Figure 18C:
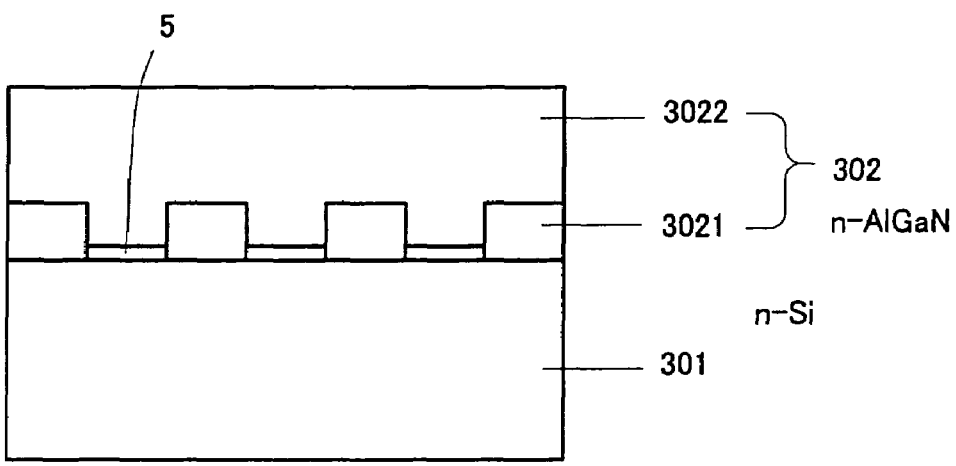

Subsequently, tungsten masks 5 were formed at the bottoms of the trenches such that the upper surfaces of the masks 5 were positioned below the top surface of the Al$_{0.15}$Ga$_{0.85}$N layer 3021. While the temperature of the n-type silicon substrate 301 was maintained at 1,150° C., H$_2$ (20 L/min), NH$_3$ (10 L/min), TMG (2 μmol/min), TMA (0.2 μmol/min), and silane (SiH$_4$) diluted with H$_2$ (4 nmol/min) were fed, to thereby form an n-Al$_{0.15}$Ga$_{0.85}$N layer 3022 through lateral epitaxial growth performed while the sidewalls of the trenches of a depth of 0.5 μm; i.e., the {11-20} planes of the n-Al$_{0.15}$Ga$_{0.85}$N layer 3021, serve as nuclei for crystal growth. At this time, virtually no vertical epitaxial growth progressed from the top surfaces of the mesas and from the masks 5 provided at the bottoms of the trenches (FIG. 18B). Lateral epitaxial growth was performed while the {11-20} planes primarily served as the growth fronts, whereby the trenches were filled or a bridge structure was provided in the trenches, and the surface of the layer 3022 become flat. Thereafter, H$_2$ (10 L/min), NH$_3$ (10 L/min), TMG (100 μmol/min), TMA (10 μmol/min), and silane (SiH$_4$) diluted with H$_2$ gas (0.2 μmol/min) were fed, to thereby further grow the n-Al$_{0.15}$Ga$_{0.85}$N layer 3022 until the overall thickness of the n-Al$_{0.15}$Ga$_{0.85}$N layer 3021 and the n-Al$_{0.15}$Ga$_{0.85}$N layer 3022 became 2 μm (FIG. 18C). Hereinafter, the n-Al$_{0.15}$Ga$_{0.85}$N layer 3021 and the n-Al$_{0.15}$Ga$_{0.85}$N layer 3022 (overall thickness: 2 μm) are inclusively represented by an n-Al$_{0.15}$Ga$_{0.85}$N layer 302.

Figure 19:
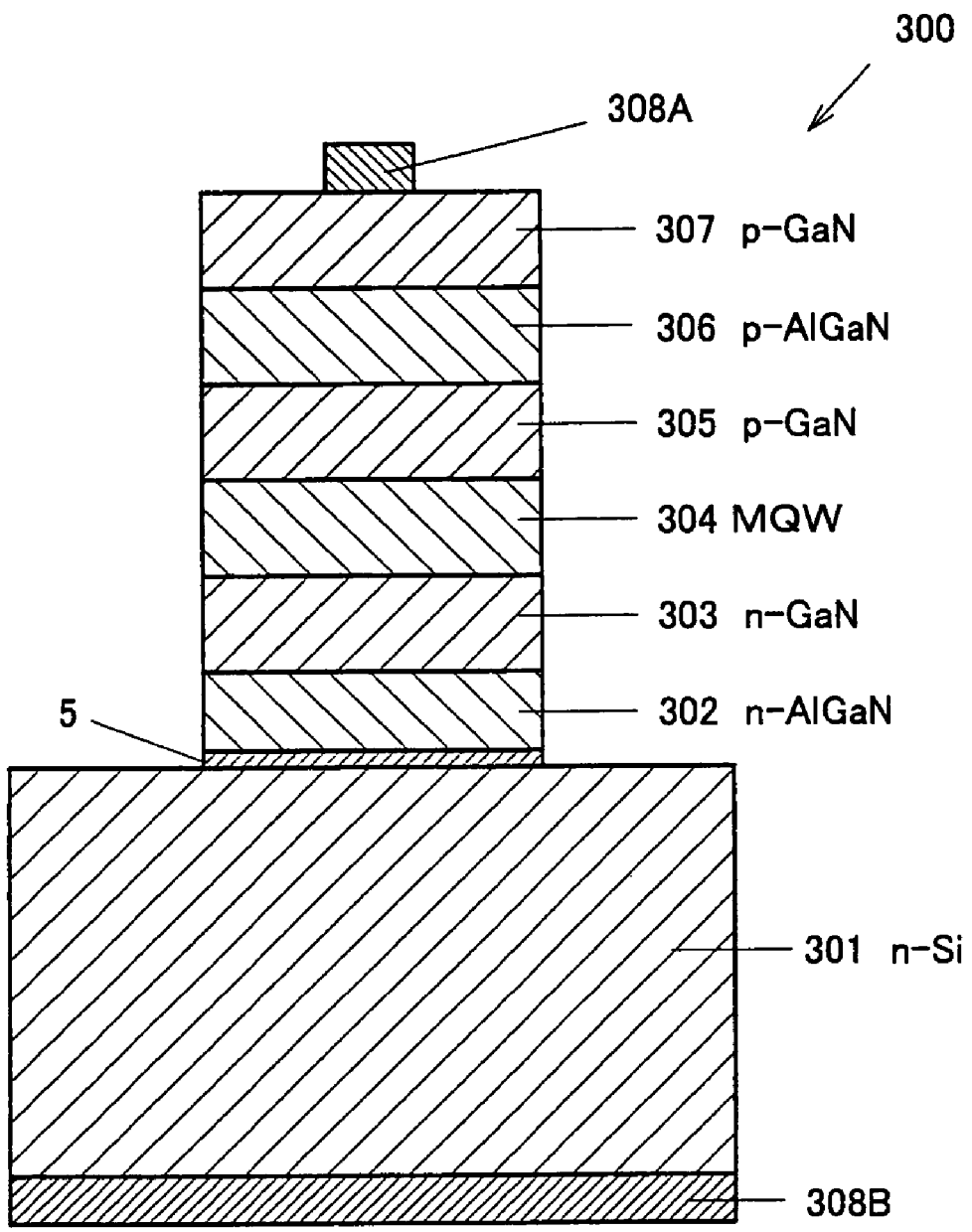
FIG. 19 is a cross-sectional view showing the structure of a Group III nitride compound semiconductor light-emitting element according to the fourteenth embodiment of the present invention.

On the n-Al$_{0.15}$Ga$_{0.85}$N layer 302 formed on the n-type silicon substrate 301, a silicon (Si)-doped GaN n-guide layer 303, an MQW-structured light-emitting layer 304, a magnesium (Mg)-doped GaN p-guide layer 305, a magnesium (Mg)-doped Al$_{0.08}$Ga$_{0.92}$N p-cladding layer 306, and a magnesium (Mg)-doped GaN p-contact layer 307 were formed. Subsequently, an electrode 308A of gold (Au) was formed on the p-contact layer 307, and an electrode 308B of aluminum (Al) was formed on the back side of the silicon substrate 301 (FIG. 19). An essential portion of a laser diode (LD) 300 was formed atop the lateral epitaxial growth regions of the n-Al$_{0.15}$Ga$_{0.85}$N layer 302; i.e., atop the regions where threading dislocation is suppressed. The thus-formed laser diode (LD) 300 exhibited significant improvement of service life and light-emitting efficiency.

Fifteenth Embodiment

Figure 20:
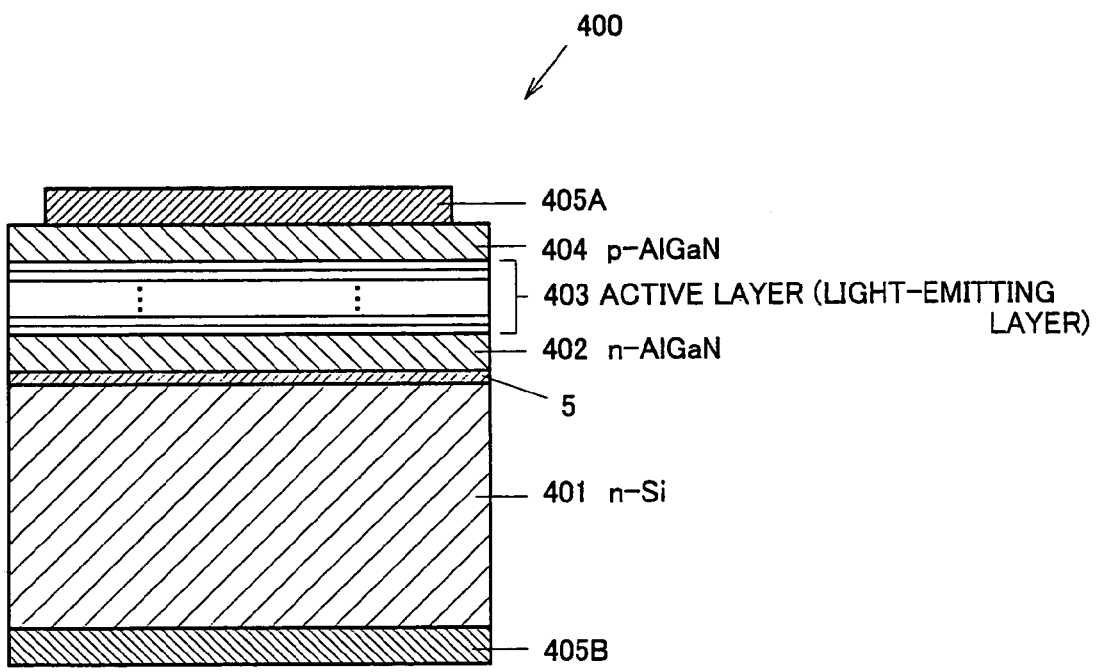
FIG. 20 is a cross-sectional view showing the structure of a Group III nitride compound semiconductor light-emitting element according to a fifteenth embodiment of the present invention.

In the present embodiment, an n-type silicon (Si) substrate was employed. As in the fourteenth embodiment which employed a wafer including the n-type silicon substrate 301 and the n-Al$_{0.15}$Ga$_{0.85}$N layer 302 formed thereon, the present embodiment prepared a wafer including an n-type silicon substrate 401 and an n-Al$_{0.15}$Ga$_{0.85}$N layer 402 formed on the substrate 401. On the wafer, a light-emitting layer 403 and a magnesium (Mg)-doped Al$_{0.15}$Ga$_{0.85}$N p-cladding layer 404 were formed. Subsequently, an electrode 405A of gold (Au) was formed on the p-cladding layer 404, and an electrode 405B of aluminum (Al) was formed on the back side of the silicon substrate 401 (FIG. 20). The thus-formed light-emitting diode (LED) 400 exhibited significant improvement of service life and light-emitting efficiency.

[Application]

Figure 21A:
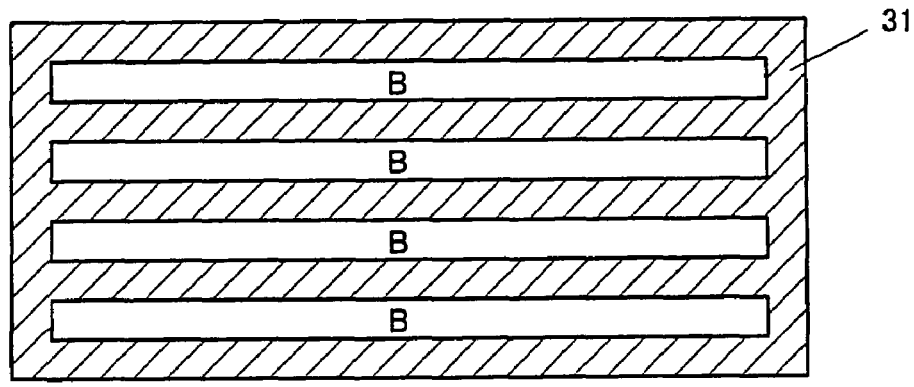
FIGS. 21A-21C are schematic representations showing another example of etching of a first Group III nitride compound semiconductor.
Figure 21B:
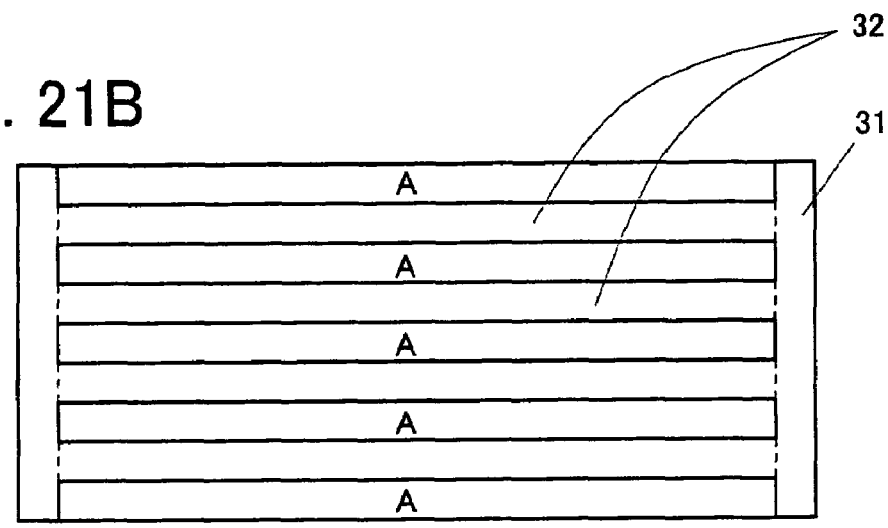
Figure 21C:
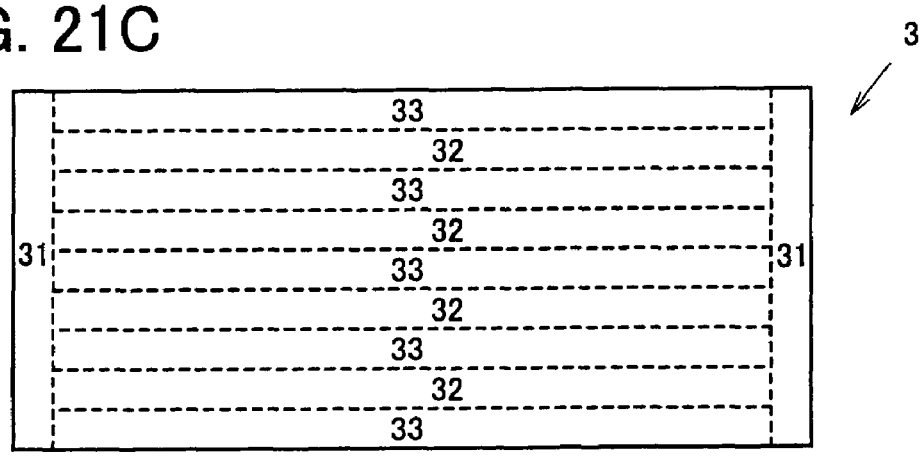
Figure 23:
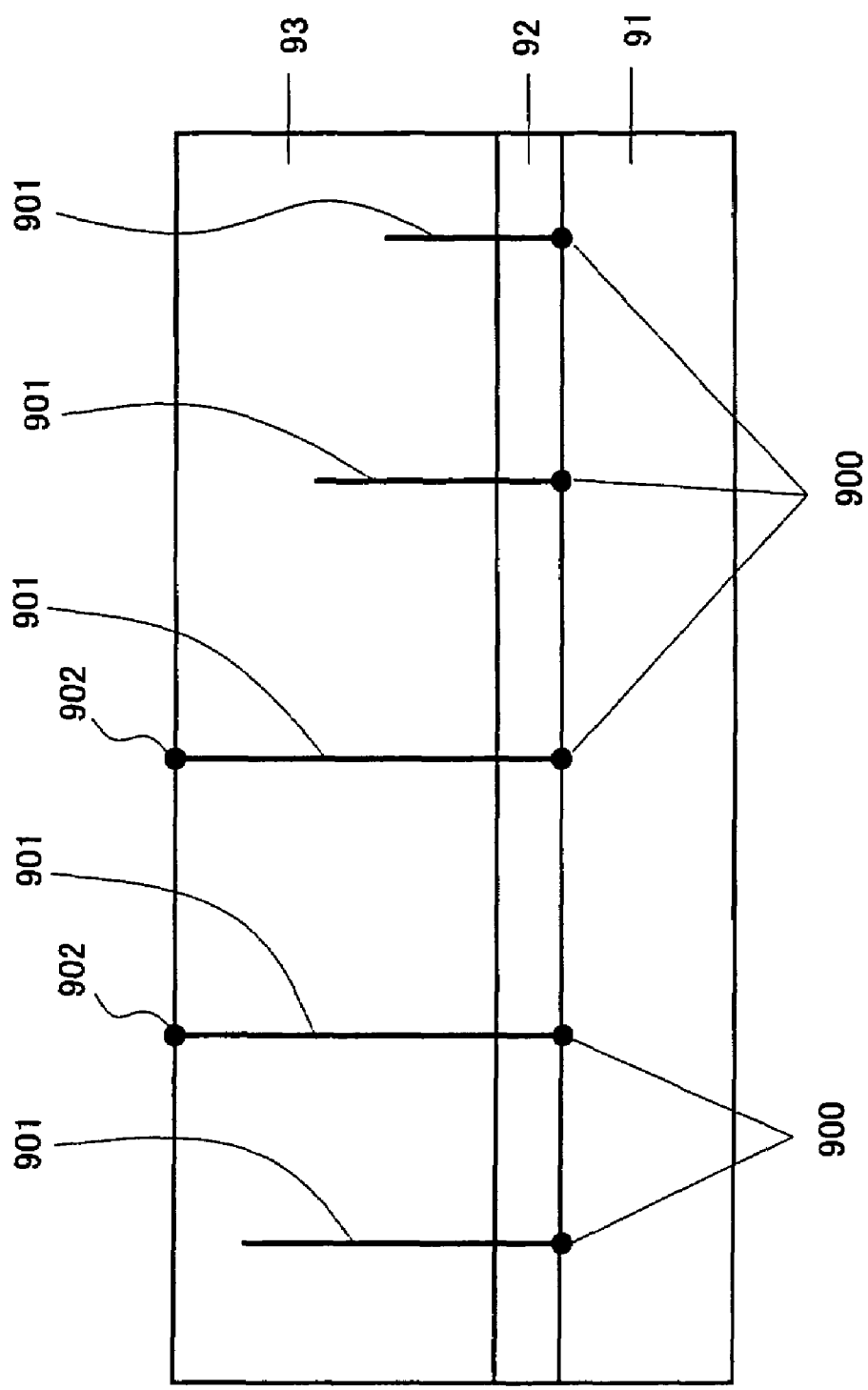
FIG. 23 is a cross-sectional view showing threading dislocations propagating in a Group III nitride compound semiconductor.

In an application of the present invention, it may be a useful alternative to etch the regions of the second GaN layer 32 where threading dislocation is not reduced, followed by lateral epitaxial growth of a GaN layer. FIG. 21 schematically shows locations of the first GaN layer 31 and the second GaN layer 32 to be etched. As shown in FIG. 21A, etching is performed in the form of stripes so as to form mesas of the GaN layer 31 (hatched in FIG. 21) and trenches denoted by letter B. A mask 4 is formed in the same manner as in the eighth embodiment. As shown in FIG. 21B, etching is performed in the form of stripes so as to form trenches denoted by letter A and mesas of the GaN layer 32 which fill the trenches above the mask denoted by letter B in FIG. 21A. A mask is formed merely at the trenches such that the upper surface of the mask is positioned below the top surface of the layer formed on a substrate. While the thus-formed mesas of the second GaN layer 32 serve as nuclei for crystal growth, a GaN layer 33 is formed through lateral epitaxial growth. As a result, as shown in FIG. 21C, there are formed regions denoted by reference numeral 31 where threading dislocation is propagated from the GaN layer 31, regions denoted by reference numeral 32 which are upper portions of the GaN layer 32 formed through lateral epitaxial growth and where threading dislocation is suppressed, and regions denoted by reference numeral 33 which are upper portions of the GaN layer 33 formed through lateral epitaxial growth and where threading dislocation is suppressed. Thus, regions of reduced threading dislocation can be formed over the substantially entire surface of a wafer. Notably, the depth of etching of the GaN layer 32 is not particularly limited. Similarly, a Group III nitride compound semiconductor substrate in which threading dislocation is suppressed over the entire surface thereof can be obtained.

[Modification of Etching]

FIG. 22 shows an example in which island-like mesas are formed by means of three groups of {11-20} planes. To facilitate understanding, the schematic view of FIG. 22A includes a peripheral region formed by means of three groups of {11-20} planes. In actuality, tens of millions of island-like mesas may be formed per wafer. In FIG. 22A, the area of the bottoms of the trenches B is 3 times the area of the top surfaces of the island-like mesas. In FIG. 22B, the area of the bottoms of the trenches B is 8 times the area of the top surfaces of the island-like mesas.

While the present invention has been described with reference to the above embodiments, the present invention is not limited thereto, but may be modified as appropriate without departing from the spirit of the invention.

The entire disclosures and contents of Japanese Patent Application Nos. 2000-99948 and 2000-99949, from which the present invention claims convention priority, are incorporated herein by reference.

The invention claimed is:

1. A Group III nitride compound semiconductor comprising:
   a substrate;
   an underlying layer comprising at least one layer of a Group III nitride compound semiconductor, an uppermost layer of said underlying layer being a first Group III nitride compound semiconductor layer, said underlying layer being formed into an island structure including a trench and mesa structure, wherein an area of a horizontal cross section of said mesa is reduced to substantially zero with respect to an increase in a distance between said cross section and said substrate;

a mask formed on and covering said first Group III nitride compound semiconductor layer except for a top portion thereof, said mask exposing the top portion of said first Group III nitride compound semiconductor layer; and a second Group III nitride compound semiconductor layer on said mask, being epitaxially grown vertically and laterally from said top portion of said first Group III nitride compound semiconductor layer, said upper surface of said second Group III nitride compound semiconductor being parallel to a surface of said substrate.

2. A Group III nitride compound semiconductor according to claim 1, said island structure comprising a plurality of laterally aligned triangular-prism-shaped mesas.

3. A Group III nitride compound semiconductor according to claim 1, said island structure comprising at least one selected from a group consisting of a plurality of cone-shaped mesas and a plurality of pyramid-shaped mesas.

4. A Group III nitride compound semiconductor according to claim 1, said first Group III nitride compound semiconductor layer and said second Group III nitride compound semiconductor layer comprising a same composition.

5. A Group III nitride compound semiconductor according to claim 1, said mask comprising an electrically conductive metal.

6. A Group III nitride compound semiconductor according to claim 5, said mask comprising tungsten (W).

7. A Group III nitride compound semiconductor device, comprising:

a layer being formed on said second Group III nitride compound semiconductor layer according to claim 1.

8. A Group III nitride compound semiconductor light-emitting device, comprising:

at least one layer of a Group III nitride compound semiconductor different from and on said second Group III nitride compound semiconductor layer according to claim 1.

9. A Group III nitride compound semiconductor substrate, comprising:

said second Group III nitride compound semiconductor remaining by removing substantially entire portions including said substrate, said mask and said underlying layer according to claim 1.

10. A Group III nitride compound semiconductor according to claim 1, wherein said island structure comprises at least one of a dot shape, a stripe shape, and a grid shape.

11. A Group III nitride compound semiconductor according to claim 1, said underlying layer comprising multiple layers including repetitions of a buffer layer and a monocrystalline intermediate layer.

* * * * *